(12) United States Patent
Lee et al.

(10) Patent No.: US 11,409,386 B2
(45) Date of Patent: Aug. 9, 2022

(54) TOUCH DISPLAY DEVICE

(71) Applicant: LG Display Co., Ltd., Seoul (KR)

(72) Inventors: Yangsik Lee, Paju-si (KR); Hwideuk Lee, Paju-si (KR); Sungsu Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/306,427

(22) Filed: May 3, 2021

(65) Prior Publication Data

US 2021/0382572 A1 Dec. 9, 2021

(30) Foreign Application Priority Data

Jun. 8, 2020 (KR) .................. 10-2020-0069235

(51) Int. Cl.
*G06F 3/041* (2006.01)
*G06F 3/044* (2006.01)

(52) U.S. Cl.
CPC .......... *G06F 3/0412* (2013.01); *G06F 3/0446* (2019.05)

(58) Field of Classification Search
CPC ............... H01L 27/323; H01L 27/3276; G06F 2203/04103; G06F 2203/04111; G06F 2203/04112; G06F 3/0412; G06F 3/04164; G06F 3/0443; G06F 3/0446

See application file for complete search history.

(56) References Cited

U.S. PATENT DOCUMENTS

2020/0233522 A1* 7/2020 Gwon ..................... G06F 3/044

* cited by examiner

*Primary Examiner* — Robin J Mishler
(74) *Attorney, Agent, or Firm* — Fenwick & West LLP

(57) ABSTRACT

Embodiments of the present disclosure are related to a touch display device, by implementing a touch routing line using a part of a display electrode metal disposed in a non-active area of a display panel, the non-active area is reduced, and the touch routing line can be disposed while preventing an increase of a load of the touch routing line. Furthermore, by connecting the touch routing line implemented with the display electrode metal under an encapsulation layer to a touch electrode on the encapsulation layer through a connecting metal located under a dam, the touch routing line can be disposed under the encapsulation layer without dropping a function of the encapsulation layer for reducing moisture permeation.

20 Claims, 30 Drawing Sheets

TOUCH DISPLAY DEVICE

CROSS REFERENCE TO RELATED APPLICATION

This application claims priority from Republic of Korea Patent Application No. 10-2020-0069235, filed on Jun. 8, 2020, which is hereby incorporated by reference in its entirety.

BACKGROUND

Field

Embodiments of the present disclosure are related to a touch display device.

Description of Related Art

The growth of the information society leads to increased demand for display devices to display images and use of various types of display devices, such as liquid crystal display devices, organic light emitting display devices, etc.

The display devices, for providing more various functions to a user, provide a function that recognizes a touch by a finger or a pen of the user that is in contact with a display panel and performs an input process based on a recognized touch.

For example, the display devices can comprise a plurality of touch electrodes disposed on the display panel, or imbedded in the display panel. Also, the display devices can sense a touch of the user to the display panel by detecting a change of a capacitance occurred by the touch of the user.

Here, the touch electrode included in the display panel can be driven to be electrically connected to a touch driving circuit through a touch routing line. The touch routing line, for example, can be disposed on a non-active area where an image is not displayed in the display panel. Accordingly, there are many difficulties in reducing a bezel area of the display panel due to an arrangement of the touch routing line.

Furthermore, in a case that arranging the touch routing line while reducing the bezel area of the display panel, there are problems that a performance of a touch sensing can be dropped due to an increase of a parasitic capacitance between the touch routing line and a line applied a signal or a voltage for display driving.

SUMMARY

Embodiments of the present disclosure can provide methods that reduce a non-active area required for arranging a touch routing line in a display panel.

Embodiments of the present disclosure can provide methods that reduce a drop of a performance of a touch sensing due to an increase of a load of the touch routing line while reducing an area where the touch routing line is disposed.

Embodiments of the present disclosure can provide structures that the touch routing line disposed under an encapsulation layer is connected to a touch electrode on the encapsulation layer and methods that prevent an occurrence of a defect due to moisture permeation in an area where the touch routing line is arranged in the structures.

In an aspect, embodiments of the present disclosure can provide a touch display device comprising a plurality of touch electrodes disposed on an active area and located on an encapsulation layer, at least one dam disposed to be apart from a boundary of the active area in at least one side of the active area, and a plurality of touch routing lines disposed on a non-active area located outside of the active area and electrically connected to at least one of the plurality of touch electrodes.

Here, the plurality of touch routing lines can comprise a first touch routing line located on the encapsulation layer between the boundary of the active area and the dam, and electrically connected to the touch electrode.

Furthermore, the plurality of touch routing lines can comprise a second touch routing line comprising a first part located under the encapsulation layer between the boundary of the active area and the dam, a second part electrically connected to the first part and located under the dam to be crossed the dam, and a third part electrically connected to the second part and located on the dam and electrically connected to the touch electrode.

The second touch routing line can further comprise a fourth part located on the encapsulation layer, overlapped with at least a portion of the first part, and electrically connected to the first part through at least one of the second part and the third part.

Furthermore, the plurality of touch routing lines can further comprise a third touch routing line, a portion of a third touch routing line is located outside of the dam, the third touch routing line is made of at least one of a same material as the first part and a same material as the third part, and the third touch routing line is electrically connected to the touch electrode.

In another aspect, embodiments of the present disclosure can provide a touch display device comprising a plurality of touch electrode disposed on an active area and located on an encapsulation layer, at least one dam disposed to be apart from a boundary of the active area in at least one side of the active area, and a plurality of touch routing lines disposed on a non-active area located outside of the active area and electrically connected to at least one of the plurality of touch electrodes, wherein at least one of the plurality of touch routing lines crosses the dam on at least two points, is located under the dam on at least one of the at least two points, and is located on the dam on at least one of the at least two points.

According to various embodiments of the present disclosure, by arranging a touch routing line using a metal using for implementing a display signal line and disposing on a non-active area, the touch routing line can be disposed in a display panel minimizing an increase of the non-active area.

According to various embodiments of the present disclosure, by arranging a touch routing line using a metal used as the display signal line and a metal used as a touch electrode together, a resistance of the touch routing line is reduced, and an increase of a load of the touch routing line can be prevented while reducing an area where the touch routing line is disposed.

According to various embodiments of the present disclosure, as the touch routing line disposed under an encapsulation layer is electrically connected to the touch electrode on the encapsulation layer through a connecting metal, the touch routing line can be connected to the touch electrode without making a hole in the encapsulation layer. Accordingly, a defect due to moisture permeation can be prevented in an area where the touch routing line is disposed, more robust structure for the moisture permeation can be provided by increasing a path of the moisture permeation by the touch routing line disposed under the encapsulation layer or a patterning structure of an insulating layer.

BRIEF DESCRIPTION OF DRAWINGS

The above and other objects, features, and advantages of the present disclosure will be more clearly understood from the following detailed description, taken in conjunction with the accompanying drawings, in which.

DETAILED DESCRIPTION

Figure 1:
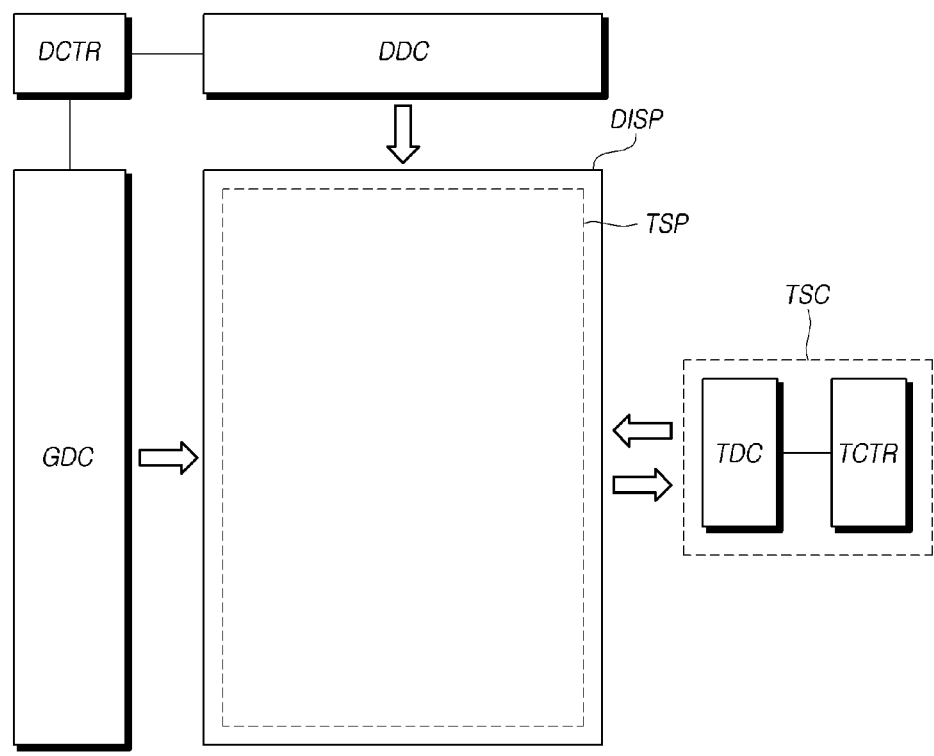
FIG. 1 is a diagram illustrating a schematic configuration of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating a system configuration of a touch display device according to embodiments.

Referring to FIG. 1, the touch display device according to embodiments of the present disclosure can provide both an image display function and a touch-sensing function.

To provide the image display function, the touch display device according to embodiments of the present disclosure can comprise: a display panel DISP in which a plurality of data lines and a plurality of gate lines are disposed and a plurality of subpixels defined by the plurality of data lines and the plurality of gate lines are arrayed; a data driver (or data driver circuit) DDC driving the plurality of data lines; a gate driver (or gate driver circuit) GDC driving the plurality of gate lines; a display controller DCTR controlling the data driver DDC and gate driver GDC, and the like.

Each of the data driver DDC, the gate driver GDC, and the display controller DCTR can be implemented as one or more separate components. In some cases, two or more of the data driver DDC, the gate driver GDC, and the display controller DCTR can be integrated into a single component. For example, the data driver DDC and the display controller DCTR can be implemented as a single integrated circuit (IC) chip.

To provide the touch-sensing function, the touch display device according to embodiments of the present disclosure can comprise: a touch panel TSP including a plurality of touch electrodes; and a touch-sensing circuit TSC supplying a touch driving signal to the touch panel TSP, detecting a touch-sensing signal from the touch panel TSP, and detecting a touch of a user or determining a touch position (touch coordinates) on the touch panel TSP on the basis of a detected touch-sensing signal.

For example, the touch-sensing circuit TSC can comprise: a touch driving circuit TDC supplying a touch driving signal to the touch panel TSP and detecting a touch-sensing signal from the touch panel TSP; a touch controller TCTR determining at least one of the touch of the user and the touch coordinates on the basis of the touch-sensing signal detected by the touch driving circuit TDC, and the like.

The touch driving circuit TDC can comprise a first circuit part supplying the touch driving signal to the touch panel TSP and a second circuit part detecting the touch-sensing signal from the touch panel TSP.

The touch driving circuit TDC and the touch controller TCTR can be provided as separate components or, in some cases, can be integrated into a single component.

In addition, each of the data driver DDC, the gate driver GDC, and the touch driving circuit TDC is implemented as one or more integrated circuits (ICs), and in terms of electrical connection to the display panel DISP, can have a chip-on-glass (COG) structure, a chip-on-film (COF) structure, a tape carrier package (TCP) structure, or the like. In addition, the gate driver GDC can have a gate-in-panel (GIP) structure.

In addition, each of the circuit configurations DDC, GDC, and DCTR for display driving and the circuit configurations TDC and TCTR for touch sensing can be implemented as one or more separate components. In some cases, one or more of the display driving circuit configurations DDC, GDC, and DCTR and one or more of the touch-sensing circuit configurations TDC and TCTR can be functionally integrated into one or more components.

For example, the data driver DDC and the touch driving circuit TDC can be integrated into one or more IC chips. In a case in which the data driver DDC and the touch driving circuit TDC are integrated into two or more IC chips, each of the two or more IC chips can have both a data driving function and a touch driving function.

In addition, the touch display device according to embodiments of the present disclosure can be various types of devices, such as an organic light-emitting diode (OLED) display device and a liquid crystal display (LCD) device.

Hereinafter, the touch display device will be described as an OLED display device for the sake of brevity. That is, although the display panel DISP can be various types of devices, such as an OLED and an LCD, the display panel DISP will be described as an OLED panel as an example for the sake of brevity.

In addition, as will be described later, the touch panel TSP can comprise a plurality of touch electrodes to which the touch driving signal is applicable or from which the touch-sensing signal is detectable; a plurality of touch routing lines connecting the plurality of touch electrodes to the touch driving circuit TDC; and the like.

The touch panel TSP can be located outside of the display panel DISP. That is, the touch panel TSP and the display panel DISP can be fabricated separately and combined thereafter. Such a touch panel TSP is referred to as an add-on touch panel.

Alternatively, the touch panel TSP can be disposed inside of the display panel DISP. That is, when the display panel DISP is fabricated, touch sensor structures of the touch panel TSP, including the plurality of touch electrodes, the plurality of touch routing lines, and the like, can be provided together with electrodes and signal lines used for the display driving. Such a touch panel TSP is referred to as an in-cell touch panel. Hereinafter, for the sake of brevity, the touch panel TSP will be described as an in-cell touch panel TSP as an example.

Figure 2:
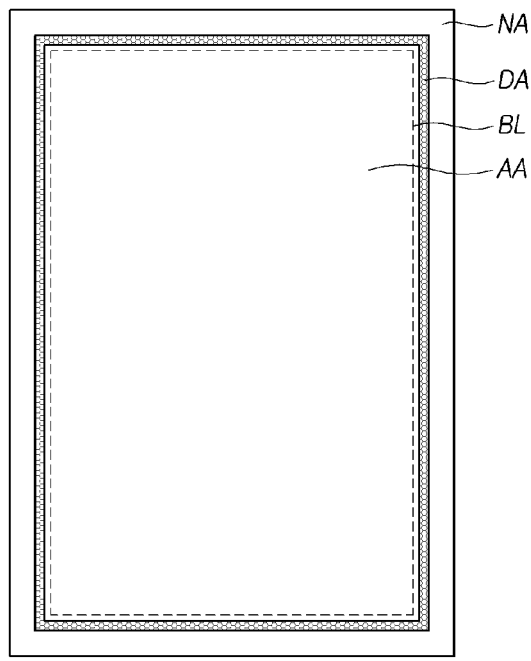
FIG. 2 is a diagram schematically illustrating a display panel of a touch display device according to embodiments of the present disclosure.

FIG. 2 is a diagram schematically illustrating the display panel DISP of the touch display device according to embodiments of the present disclosure.

Referring to FIG. 2, the display panel DISP can comprise an active area AA on which images are displayed and a non-active area NA located outside of an outer boundary line BL of the active area AA.

In the active area AA of the display panel DISP, a plurality of subpixels for displaying images are arrayed, and a variety of electrodes and signal lines for the display driving area are disposed.

In addition, the plurality of touch electrodes for the touch sensing, the plurality of touch routing lines electrically connected to the plurality of touch electrodes, and the like can be disposed in the active area AA of the display panel DISP. Accordingly, the active area AA can also be referred to as a touch-sensing area in which the touch sensing can be performed.

In the non-active area NA of the display panel DISP, link lines produced by extending a variety of signal lines disposed in the active area AA or link lines electrically connected to the variety of signal lines disposed in the active area AA and pads electrically connected to the link lines can be disposed. The pads disposed in the non-active area NA can be bonded or electrically connected to the display driving circuits, such as DDC and GDC.

In addition, in the non-active area NA of the display panel DISP, link lines produced by extending a plurality of touch routing lines disposed in the active area AA or link lines electrically connected to the plurality of touch routing lines disposed in the active area AA and pads electrically connected to the link lines can be disposed. The pads disposed in the non-active area NA can be bonded or electrically connected to the touch driving circuit TDC.

In the non-active area NA, portions produced by expanding portions of the outermost touch electrodes among the plurality of touch electrodes disposed in the active area AA can be provided, and one or more electrodes (e.g. touch electrodes) made of the same material as the plurality of touch electrodes disposed in the active area AA can be further disposed.

That is, the entirety of the plurality of touch electrodes disposed in the display panel DISP can be located in the active area AA, specific touch electrodes (e.g. the outermost touch electrodes) among the plurality of touch electrodes disposed in the display panel DISP can be located in the non-active area NA, or specific touch electrodes (e.g. the outermost touch electrodes) among the plurality of touch electrodes disposed in the display panel DISP can extend across at least a portion of the active area AA and at least a portion of the non-active area NA.

In addition, referring to FIG. 2, the display panel DISP of the touch display device according to embodiments of the present disclosure can comprise a dam area DA in which a dam DAM (see FIG. 9) is disposed, the dam DAM serves to prevent or reduce collapsing of a layer (e.g. an encapsulation layer in the OLED display panel) in the active area AA.

The dam area DA can be located at the boundary between the active area AA and the non-active area NA, in a location of the non-active area NA at the periphery of the active area AA, or the like.

The dam disposed in the dam area DA can be disposed to surround the active area AA in all directions or only at the periphery of one or more portions (i.e. portions in which a fragile layer is located) of the active area AA.

The dams disposed in the dam area DA can be connected to be made as a single pattern or to be made as two or more separate patterns. In addition, in the dam area DA, only a first dam can be disposed, or two dams (i.e. a first dam and a second dam) can be disposed, or three or more dams can be disposed.

In the dam area DA, the first dam can only be provided in one direction, and both the first dam and the second dam can be provided in the other direction.

Figure 3:
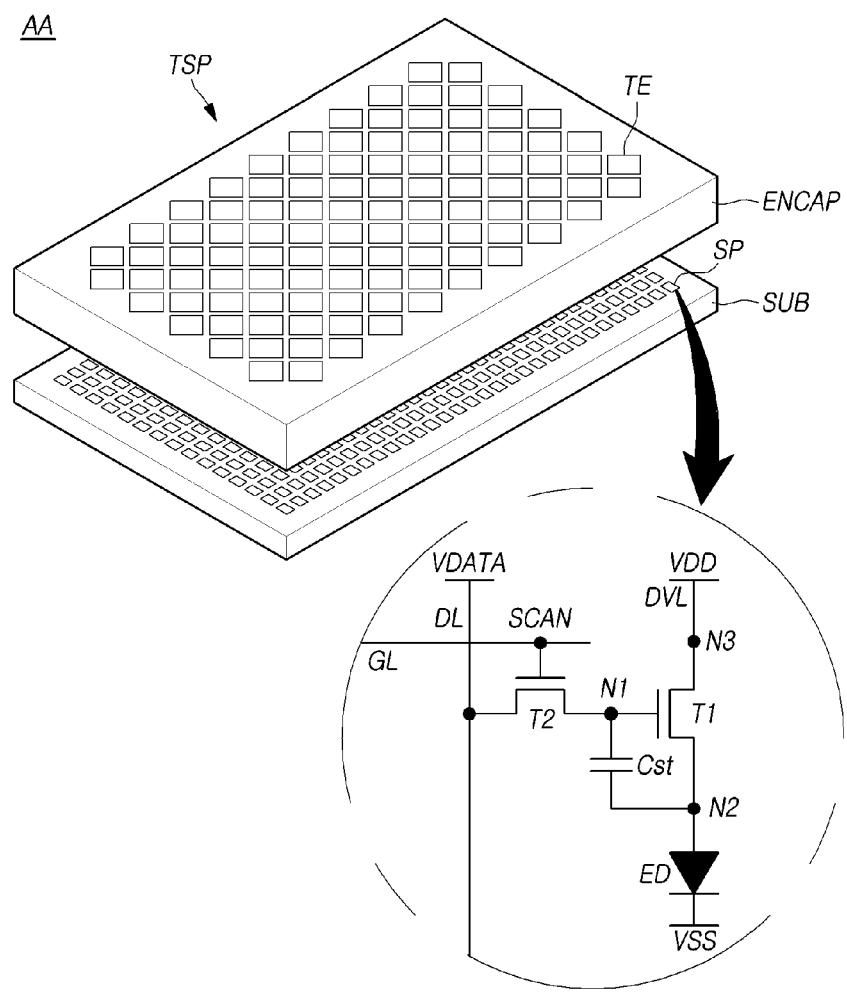
FIG. 3 is a diagram illustrating a structure in which a touch panel is disposed as an in-cell structure in a display panel according to embodiments of the present disclosure.

FIG. 3 is a diagram illustrating a structure in which the touch panel TSP is disposed as an in-cell structure in the display panel DISP according to embodiments of the present disclosure.

Referring to FIG. 3, a plurality of subpixels SP are arrayed on a substrate SUB in the active area AA of the display panel DISP.

Each of the subpixels SP can comprise an emitting device ED, a first transistor T1 driving the emitting device ED, a second transistor T2 delivering a data voltage VDATA to a first node N1 of the first transistor T1, a storage capacitor Cst maintaining a predetermined voltage for a single frame, and the like.

The first transistor T1 can comprise the first node N1 to which the data voltage VDATA is applicable, a second node N2 electrically connected to the emitting device ED, and a third node N3 to which a driving voltage VDD is applied from a driving voltage line DVL. The first node N1 can be a gate node, the second node N2 can be a source node or a drain node, and the third node N3 can be a drain node or a source node. Such a first transistor T1 is also referred to as a driving transistor driving the emitting device ED.

The emitting device ED can comprise a first electrode (e.g., an anode), an emissive layer, and a second electrode (e.g., a cathode). The first electrode can be electrically connected to the second node N2 of the first transistor T1, and the second electrode can have a base voltage VSS applied thereto.

The emissive layer of the emitting device ED can be an organic emissive layer containing an organic material. In this case, the emitting device ED can be an organic light-emitting diode (OLED).

The second transistor T2 can be on/off controlled by a scan signal SCAN applied through a gate line GL and be electrically connected to the first node N1 of the first transistor T1 and a data line DL. Such a second transistor T2 is also referred to as a switching transistor.

When the second transistor T2 is turned on by the scan signal SCAN, the second transistor T2 delivers the data voltage VDATA supplied through the data line DL to the first node N1 of the first transistor T1.

The storage capacitor Cst can be electrically connected to the first node N1 and the second node N2 of the first transistor T1.

As illustrated in FIG. 3, each of the subpixels SP can have a 2T1C comprised of two transistors T1 and T2 and a single capacitor Cst. In some cases, each of the subpixels SP can further comprise one or more transistors or one or more capacitors.

The storage capacitor Cst can be an external capacitor intentionally designed to be disposed externally of the first transistor T1, rather than a parasitic capacitor (e.g., Cgs or Cgd), i.e., an internal capacitor present between the first node N1 and the second node N2 of the first transistor T1.

Each of the first transistor T1 and the second transistor T2 can be an n-type transistor or a p-type transistor.

As described above, circuit components, including the emitting device ED, two or more transistors T1 and T2, and one or more capacitor Cst, are disposed in the display panel DISP. Since such circuit components (in particular, the emitting device ED) are vulnerable to external moisture, oxygen, or the like, an encapsulation layer ENCAP that reduces penetration of external moisture or oxygen into the circuit elements (in particular, the emitting device ED) can be disposed in the display panel DISP.

Such an encapsulation layer ENCAP can be a single layer or have a multilayer structure.

In addition, in the touch display device according to embodiments of the present disclosure, the touch panel TSP can be disposed on the encapsulation layer ENCAP.

That is, in the touch display device, a touch sensor structure, including the plurality of touch electrodes TE, of the touch panel TSP can be disposed on the encapsulation layer ENCAP.

In the touch sensing, the touch driving signal or the touch-sensing signal can be applied to the touch electrodes TE. Then, in the touch sensing, a potential difference can be produced between a touch electrode TE and a cathode disposed on both sides of the encapsulation layer ENCAP, thereby generating unnecessary parasitic capacitance. Since such parasitic capacitance can reduce touch sensitivity, the distance between the touch electrode TE and the cathode can be designed to be a predetermined value (e.g. 1 μm) or more in consideration of the thickness of the panel, a panel fabrication process, display performance, and the like in order to reduce the parasitic capacitance. In this regard, for example, the thickness of the encapsulation layer ENCAP can be designed to be 1 μm or more.

Figure 4:
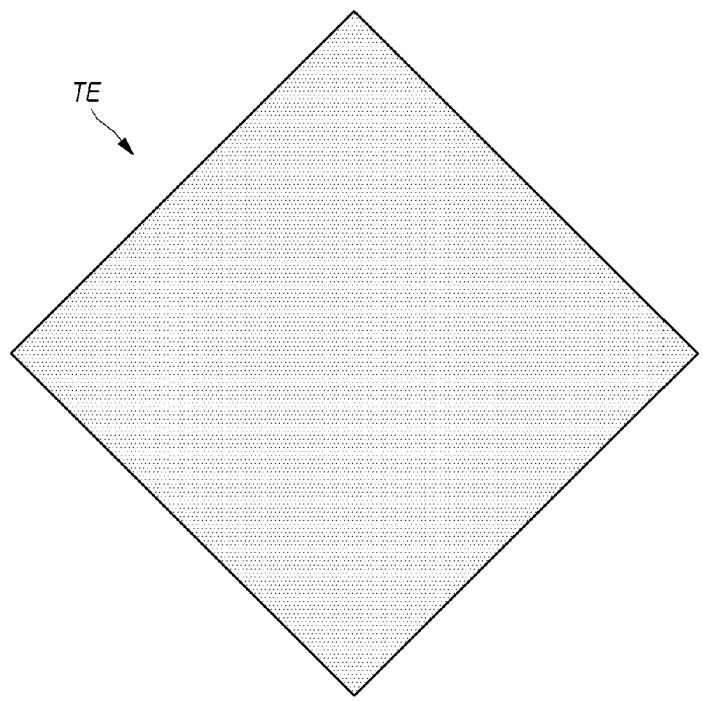
FIGS. 4 and 5 are diagrams illustrating types of touch electrodes disposed in a display panel according to embodiments of the present disclosure.
Figure 5:
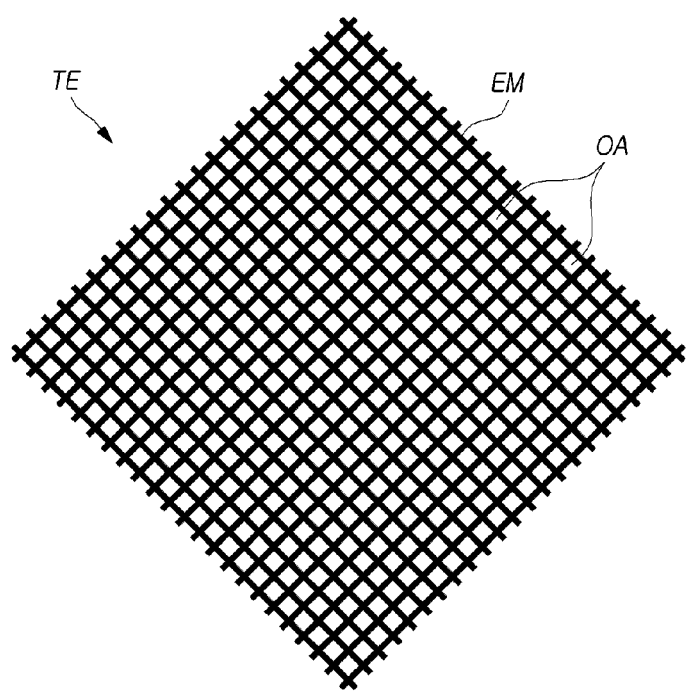

FIGS. 4 and 5 are diagrams illustrating types of touch electrodes TE disposed in the display panel DISP according to embodiments of the present disclosure.

As illustrated in FIG. 4, each of the touch electrodes TE disposed in the display panel DISP can be a plate-shaped electrode metal without an open area. In this case, each of the touch electrodes TE can be a transparent electrode. That is, each of the touch electrodes TE can be made of a transparent electrode material such that light emitted by the plurality of subpixels SP disposed below the touch electrodes TE can pass through the touch electrodes TE.

Alternatively, as illustrated in FIG. 5, each of the touch electrodes TE disposed in the display panel DISP can be an electrode metal EM in the shape of a patterned mesh having two or more open areas OA.

The electrode metal EM is a portion substantially corresponding to the touch electrode TE and is a portion to which the touch driving signal is applied or from which the touch-sensing signal is detected.

As illustrated in FIG. 5, in a case in which each of the touch electrodes TE is the electrode metal EM in the shape of a patterned mesh, two or more open areas OA can be present in the area of the touch electrode TE.

Each of the plurality of open areas OA provided in each of the touch electrodes TE can correspond to the emitting area of one or more subpixels SP. That is, the plurality of open areas OA are passages allowing light emitted from the plurality of subpixels SP located there below to pass upward therethrough. Hereinafter, for the sake of brevity, each of the touch electrodes TE will be described as a mesh-shaped electrode metal EM as an example.

The electrode metal EM corresponding to each of the touch electrodes TE can be located on a bank disposed in an area, except for the emitting area of two or more subpixels SP.

In addition, a method of fabricating a plurality of touch electrodes TE can comprise making a mesh-shaped electrode metal EM having a wider area and then cutting the electrode metal EM to be made as a predetermined pattern such that portions of the electrode metal EM are electrically separated from each other, thereby fabricating a plurality of touch electrodes TE.

The outline of the touch electrode TE can have a rectangular shape, such as a diamond or a rhombus shape, as illustrated in FIGS. 4 and 5, or a variety of other shapes, such as a triangle, a pentagon, or a hexagon.

Figure 6:
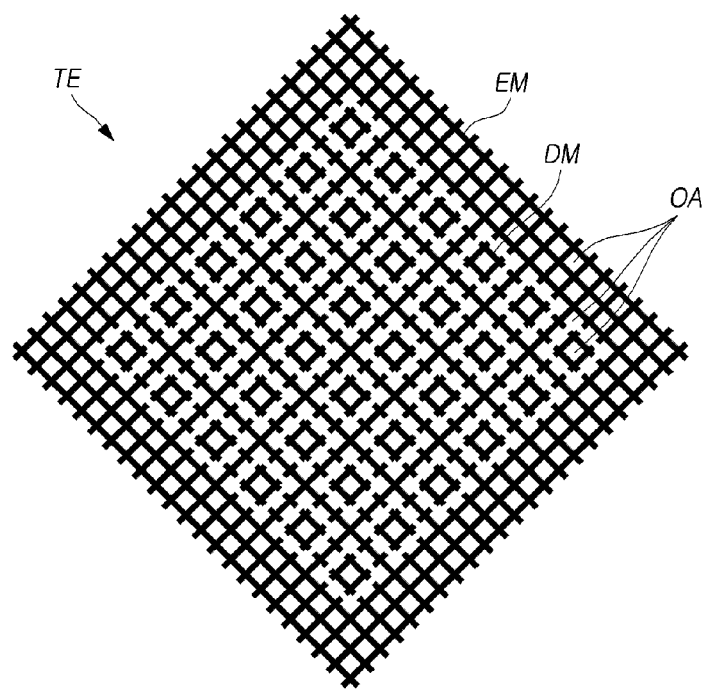
FIG. 6 is a diagram illustrating the mesh-shaped touch electrode illustrated in FIG. 5 according to an embodiment of the present disclosure.

FIG. 6 is a diagram illustrating the mesh-shaped touch electrode TE illustrated in FIG. 5.

Referring to FIG. 6, in the area of each of the touch electrodes TE, one or more dummy metals DM disconnected from the mesh-shaped electrode metal EM can be provided.

The electrode metal EM is a portion substantially corresponding to the touch electrode TE and is a portion to which the touch driving signal is applied or from which the touch-sensing signal is detected. In contrast, the dummy metals DM are portions to which the touch driving signal is not applied and from which the touch-sensing signal is not detected, although the dummy metals DM are portions located in the area of the touch electrode TE. That is, the dummy metals DM can be electrically floating metals.

Thus, the electrode metal EM can be electrically connected to the touch driving circuit TDC, but none of the dummy metals DM are electrically connected to the touch driving circuit TDC.

In the area of each of the entire touch electrodes TE, one or more dummy metals DM can be provided while being disconnected from the electrode metals EM.

Alternatively, one or more dummy metals DM can be provided in the area of each of specific touch electrodes TE among the entire touch electrodes TE while being disconnected from the electrode metal EM. That is, no dummy metals DM can be provided in the areas of the other touch electrodes TE.

The function of the dummy metals DM is related to a visibility issue. In a case in which only the mesh-shaped electrode metal EM is present in the area of the touch electrode TE without one or more dummy metals DM being present in the area of the touch electrode TE as illustrated in FIG. 5, the outline of the electrode metal EM can appear on the screen, thereby causing a visibility issue.

In contrast, in a case in which one or more dummy metals DM are present in the area of the touch electrode TE as illustrated in FIG. 6, the outline of the electrode metal EM appearing on the screen, i.e., the visibility issue, can be prevented or at least reduced.

In addition, touch sensitivity can be improved by adjusting the magnitude of capacitance according to each of the touch electrodes TE by adjusting the presence or absence or the number (or ratio) of the dummy metals DM of each of the touch electrodes TE.

In addition, specific points of the electrode metal EM provided in the area of a single touch electrode TE can be cut, so that the cut electrode metal EM form dummy metals DM. That is, the electrode metal EM and the dummy metals DM can be made of the same material provided on the same layer.

In addition, the touch display device according to embodiments of the present disclosure can detect a touch on the basis of capacitance generated on the touch electrode TE.

The touch display device according to embodiments of the present disclosure can detect a touch by a capacitance-based touch sensing method, more particularly, mutual capacitance-based touch sensing or self-capacitance-based touch sensing.

In the mutual capacitance-based touch sensing, the plurality of touch electrodes TE can be divided into driving touch electrodes (or transmitting touch electrodes) to which the touch driving signal is applied and sensing touch electrodes (or receiving touch electrodes) detecting the touch sensing signal and generating capacitance together with the driving touch electrodes.

In the mutual capacitance-based touch sensing, the touch-sensing circuit TSC detects a touch and determines touch coordinates on the basis of changes in the capacitance (i.e. mutual capacitance) occurring between the driving touch electrodes and the sensing touch electrodes, depending on the presence or absence of a pointer, such as a finger or a pen.

In the self-capacitance-based touch sensing, each of the touch electrodes TE serves as both a driving touch electrode and a sensing touch electrode. That is, the touch-sensing circuit TSC detects a touch and determines touch coordinates by applying the touch driving signal to one or more touch electrodes TE, detecting the touch-sensing signal through the touch electrode TE to which the touch driving signal is applied, and recognizing changes in the capacitance between the pointer, such as a finger or a pen, and the touch electrode TE, on the basis of the detected touch-sensing signal. Accordingly, in the self-capacitance-based touch sensing, there is no difference between the driving touch electrodes and the sensing touch electrodes.

As described above, the touch display device according to embodiments of the present disclosure can perform the touch sensing by the mutual capacitance-based touch sensing or the self-capacitance-based touch sensing. Hereinafter, for the sake of brevity, the touch display device performing the mutual capacitance-based touch sensing and having a touch sensor structure for the mutual capacitance-based touch sensing will be described as an example.

Figure 7:
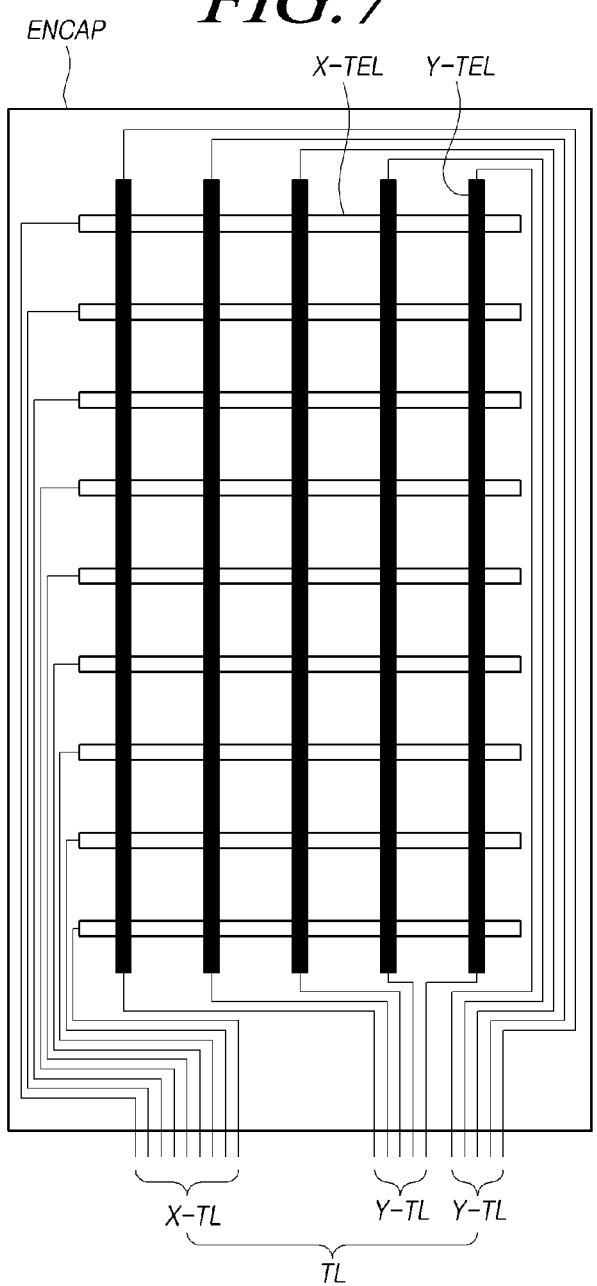
FIG. 7 is a diagram schematically illustrating a touch sensor structure in a display panel according to embodiments of the present disclosure.
Figure 8:
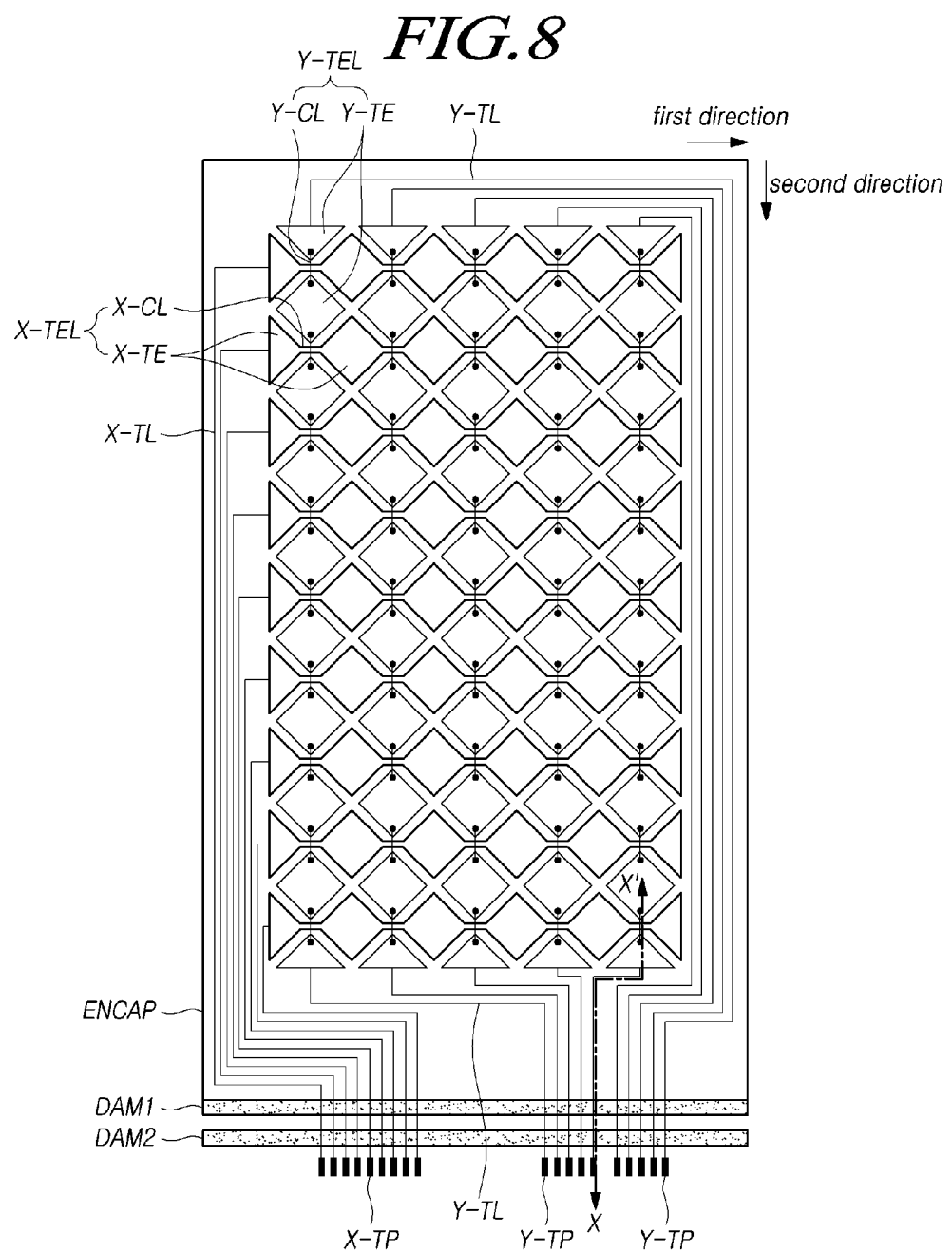
FIG. 8 is a diagram illustrating an example of the touch sensor structure illustrated in FIG. 7 according to an embodiment of the present disclosure.

FIG. 7 is a diagram schematically illustrating a touch sensor structure in the display panel DISP according to embodiments of the present disclosure, and FIG. 8 is a diagram illustrating an example of the touch sensor structure illustrated in FIG. 7.

Referring to FIG. 7, the touch sensor structure for the mutual capacitance-based touch sensing can comprise a plurality of X-touch electrode lines X-TEL and a plurality of Y-touch electrode lines Y-TEL. Here, the plurality of X-touch electrode lines X-TEL and the plurality of Y-touch electrode lines Y-TEL are located on the encapsulation layer ENCAP.

Each of the plurality of X-touch electrode lines X-TEL can be disposed in a first direction, and the plurality of Y-touch electrode lines Y-TEL can be disposed in a second direction different from the first direction.

Herein, the first direction and the second direction can be different directions. For example, the first direction can be the X-axis direction, while the second direction can be the Y-axis direction. Alternatively, the first direction can be the Y-axis direction, while the second direction can be the X-axis direction. In addition, the first direction and the second direction can or cannot intersect perpendicularly. In addition, the terms "column" and "row" as used herein are relative terms. The column and the row can be switched depending on the viewing perspective.

Each of the plurality of X-touch electrode lines X-TEL can be comprised of a plurality of X-touch electrodes X-TE electrically connected to each other. Each of the plurality of Y-touch electrode lines Y-TEL can be comprised of a plurality of Y-touch electrodes Y-TE electrically connected to each other.

Here, the plurality of X-touch electrodes X-TE and the plurality of Y-touch electrodes Y-TE are electrodes included in the plurality of touch electrodes TE, and have different functions.

For example, the plurality of X-touch electrodes X-TE constituting each of the plurality of X-touch electrode lines X-TEL can be the driving touch electrodes, while the plurality of Y-touch electrodes Y-TE constituting each of the plurality of Y-touch electrode lines Y-TEL can be the sensing touch electrodes. In this case, each of the plurality of X-touch electrode lines X-TEL corresponds to a driving touch electrode lines, and each of the plurality of Y-touch electrode lines Y-TEL corresponds to a sensing touch electrode line.

Alternatively, the plurality of X-touch electrodes X-TE constituting each of the plurality of X-touch electrode lines X-TEL can be the sensing touch electrodes, while the plurality of Y-touch electrodes Y-TE constituting each of the plurality of Y-touch electrode lines Y-TEL can be the driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

A touch sensor metal TSM for the touch sensing can comprise a plurality of touch routing lines TL in addition to the plurality of X-touch electrode lines X-TEL and the plurality of Y-touch electrode lines Y-TEL.

The plurality of touch routing lines TL can comprise one or more X-touch routing lines X-TL connected to the plurality of X-touch electrode lines X-TEL, respectively, and one or more Y-touch routing lines Y-TL connected to the plurality of Y-touch electrode lines Y-TEL, respectively.

Referring to FIG. 8, each of the plurality of X-touch electrode lines X-TEL can comprise a plurality of X-touch electrodes X-TE disposed in the same row (or column) and one or more X-touch electrode connecting lines X-CL electrically connecting the plurality of X-touch electrodes X-TE. Here, the X-touch electrode connecting lines X-CL respectively connecting two adjacent X-touch electrodes X-TE can be metals integrated with the two adjacent X-touch electrodes X-TE (see FIG. 8) or metals connected to the two adjacent X-touch electrodes X-TE via contact holes.

Each of the plurality of Y-touch electrode lines Y-TEL can comprise a plurality of Y-touch electrodes Y-TE disposed in the same column (or row) and one or more Y-touch electrode connecting lines Y-CL electrically connecting the plurality of Y-touch electrodes Y-TE. Here, the Y-touch electrode connecting lines Y-CL respectively connecting two adjacent Y-touch electrodes Y-TE can be metals integrated with the two adjacent Y-touch electrodes Y-TE or metals connected to the two adjacent Y-touch electrodes Y-TE via contact holes (see FIG. 8).

In areas in which the X-touch electrode lines X-TEL intersect the Y-touch electrode lines Y-TEL (i.e. touch electrode line intersecting areas), the X-touch electrode connecting lines X-CL can intersect the Y-touch electrode connecting lines Y-CL.

In a case in which the X-touch electrode connecting lines X-CL intersect the Y-touch electrode connecting lines Y-CL in the touch electrode line intersecting areas as described above, the X-touch electrode connecting lines X-CL must be located on a layer different from that of the Y-touch electrode connecting lines Y-CL.

Accordingly, the plurality of X-touch electrodes X-TE, the plurality of X-touch electrode connecting lines X-CL, the plurality of Y-touch electrodes Y-TE, the plurality of Y-touch electrode lines Y-TEL, and the plurality of Y-touch electrode connecting lines Y-CL can be located on two or more layers, such that the plurality of X-touch electrode lines X-TEL intersect the plurality of Y-touch electrode lines Y-TEL.

Referring to FIG. 8, each of the plurality of X-touch electrode lines X-TEL is electrically connected to a corresponding X-touch pad X-TP through one or more X-touch routing lines X-TL. That is, the outermost X-touch electrode X-TE among the plurality of X-touch electrodes X-TE included in a single X-touch electrode line X-TEL is electrically connected to a corresponding X-touch pad X-TP via the X-touch routing line X-TL.

Each of the plurality of Y-touch electrode lines Y-TEL is electrically connected to corresponding Y-touch pads Y-TP through one or more Y-touch routing lines Y-TL. That is, the outermost Y-touch electrodes Y-TE among the plurality of Y-touch electrodes Y-TE included in a single Y-touch electrode line Y-TEL is electrically connected to the corresponding Y-touch pads Y-TP through the Y-touch routing lines Y-TL.

In addition, as illustrated in FIG. 8, the plurality of X-touch electrode lines X-TEL and the plurality of Y-touch electrode lines Y-TEL can be disposed on the encapsulation layer ENCAP. That is, the plurality of X-touch electrodes X-TE, constituting the plurality of X-touch electrode lines X-TEL, and the plurality of X-touch electrode connecting lines X-CL can be disposed on the encapsulation layer ENCAP. The plurality of Y-touch electrodes Y-TE, constituting the plurality of Y-touch electrode lines Y-TEL, and the plurality of Y-touch electrode connecting lines Y-CL can be disposed on the encapsulation layer ENCAP.

In addition, as illustrated in FIG. 8, the plurality of X-touch routing lines X-TL electrically connected to the plurality of X-touch electrode lines X-TEL can be disposed on the encapsulation layer ENCAP and extend to a location in which the encapsulation layer ENCAP is not provided, thereby being electrically connected to a plurality of X-touch pads X-TP, respectively. The plurality of Y-touch routing lines Y-TL electrically connected to the plurality of Y-touch electrode lines Y-TEL can be disposed on the encapsulation layer ENCAP and extend to a location in which encapsulation layer ENCAP is not provided, thereby being electrically connected to a plurality of Y-touch pads Y-TP, respectively. Here, the encapsulation layer ENCAP can be located in the active area AA and, in some cases, can expand to the non-active area NA.

In addition, as described above, a dam area DA can be provided at the boundary between the active area AA and the non-active area NA or in the non-active area NA at the periphery of the active area AA in order to prevent or reduce collapsing of a layer (e.g. an encapsulation in the OLED display panel) in the active area AA.

As illustrated in FIG. 8, for example, a first dam DAM1 and a second dam DAM2 can be disposed in the dam area DA. Here, the second dam DAM2 can be located more outward than the first dam DAM1.

In a manner different from that illustrated in FIG. 8, only the first dam DAM1 can be located in the dam area DA. In some cases, not only the first dam DAM1 and the second dam DAM2 but also one or more additional dam can be disposed in the dam area DA.

Referring to FIG. 8, the encapsulation layer ENCAP can be located on a side of the first dam DAM1 or be located both on a side of and above the first dam DAM1.

Figure 9:
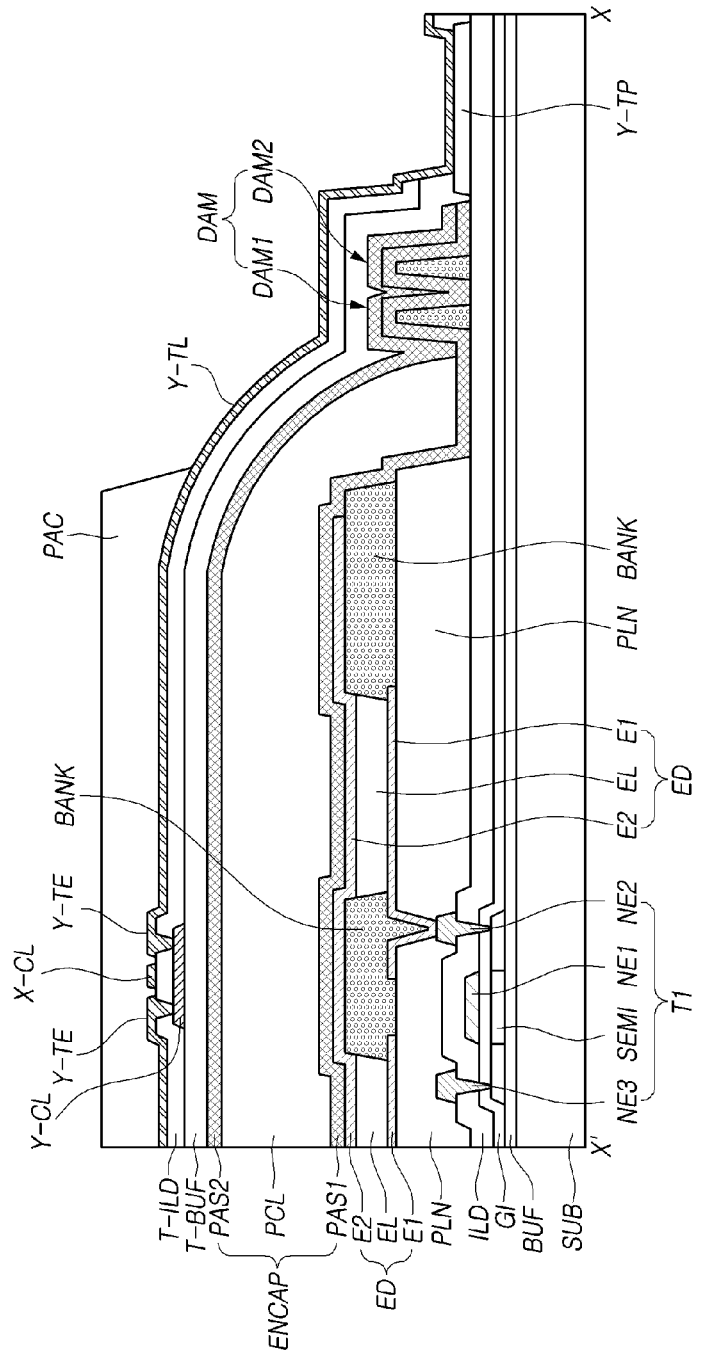
FIG. 9 is a cross-sectional diagram illustrating portions of the display panel according to embodiments of the present disclosure, taken along line X-X' in FIG. 8 according to an embodiment of the present disclosure.

FIG. 9 is a cross-sectional diagram illustrating portions of the display panel DISP according to embodiments of the present disclosure, taken along line X-X' in FIG. 8. In FIG. 9, the touch electrode TE is illustrated in the shape of a plate. However, this is illustrative only, and the touch electrode TE can be mesh shaped. In a case in which the touch electrode TE is mesh shaped, the open areas OA of the touch electrode TE can be located above the emissive areas of subpixels SP.

The first transistor T1, i.e., the driving transistor in each of the subpixels SP in the active area AA, is disposed on the substrate SUB.

The first transistor T1 comprises a first node electrode NE1 corresponding to the gate electrode, a second node electrode NE2 corresponding to a source electrode or a drain electrode, a third node electrode NE3 corresponding to a drain electrode or a source electrode, a semiconductor layer SEMI, and the like.

The first node electrode NE1 and the semiconductor layer SEMI can be located on both sides of a gate insulating film GI to overlap each other. The second node electrode NE2 can be provided on an insulating layer ILD to be in contact with one side of the semiconductor layer SEMI, while the third node electrode NE3 can be provided on the insulating layer ILD to be in contact with the other side of the semiconductor layer SEMI.

The emitting device ED can comprise a first electrode E1 corresponding to an anode (or cathode), an emitting layer EL provided on the first electrode E1, a second electrode E2 corresponding to a cathode (or anode) provided on the emitting layer EL, and the like.

The first electrode E1 is electrically connected to the second node electrode NE2 of the first transistor T1, exposed through a pixel contact hole extending through a planarization layer PLN.

The emitting layer EL is provided on the first electrode E1 in the emitting area provided by banks BANK. The emitting layer EL is provided on the first electrode E1 and is comprised of a hole-related layer, an emissive layer, and an electron-related layer stacked in the stated order or inversely. The second electrode E2 is provided on the side of the emitting layer EL opposite to the first electrode E1.

The encapsulation layer ENCAP prevents or reduces penetration of external moisture or oxygen into the emitting device ED which is vulnerable to external moisture, oxygen, or the like.

The encapsulation layer ENCAP can be a single layer or, as illustrated in FIG. 9, be comprised of a plurality of layers PAS1, PCL, and PAS2.

For example, in a case in which the encapsulation layer ENCAP is comprised of the plurality of layers PAS1, PCL, and PAS2, the encapsulation layer ENCAP can comprise one or more inorganic encapsulation layers PAS1 and PAS2 and one or more organic encapsulation layers PCL. As a specific example, the encapsulation layer ENCAP can have a structure in which the first inorganic encapsulation layer PAS1, the organic encapsulation layer PCL, and the second inorganic encapsulation layer PAS2 are stacked in order.

Here, the organic encapsulation layer PCL can further comprise at least one organic encapsulation layer or at least one inorganic encapsulation layer.

The first inorganic encapsulation layer PAS1 is provided on the substrate SUB, on which the second electrode E2 corresponding to the cathode is provided, so as to be closest to the emitting device ED. The first inorganic encapsulation layer PAS1 is made of an inorganic insulating material, such as silicon nitride (SiNx), silicon oxide (SiOx), silicon oxynitride (SiON), or aluminum oxide ($Al_2O_3$), which can be deposited at a low temperature. Since the first inorganic encapsulation layer PAS1 is deposited in a low-temperature atmosphere, the first inorganic encapsulation layer PAS1 can prevent or reduce damage to the emitting layer EL containing an organic material that is vulnerable to a high-temperature atmosphere during deposition processing.

The organic encapsulation layer PCL can be provided in an area smaller than the area of the first inorganic encapsulation layer PAS1. In this case, the organic encapsulation layer PCL can be configured to expose both edges of the first inorganic encapsulation layer PAS1. The organic encapsulation layer PCL can serve as a buffer to reduce stress between the layers caused by bending of the touch display device and serve to enhance planarization performance. The organic encapsulation layer PCL can be made of, for example, an organic insulating material, such as an acrylic resin, an epoxy resin, polyimide, polyethylene, silicon oxycarbon (SiOC).

In addition, in a case in which the organic encapsulation layer PCL is fabricated by inkjet printing, one or more dams DAM can be provided in the dam area DA corresponding to the boundary between the non-active area NA and the active area AA or a portion of the non-active area NA.

For example, as illustrated in FIG. 9, the dam area DA is located between a pad area in the non-active area NA and the active area AA. The pad area refers to a portion of the non-active area NA in which the plurality of X-touch pads X-TP and the plurality of Y-touch pads Y-TP are provided. In the dam area DA, the first dam DAM1 adjacent to the active area AA and the second dam DAM2 adjacent to the pad area can be provided.

The one or more dams DAM disposed in the dam area DA can prevent or reduce the organic encapsulation layer PCL in a liquid form from collapsing in the direction of the non-active area NA and penetrating into the pad area when the organic encapsulation layer PCL in the liquid form is dropped to the active area AA.

This effect can be further increased by the provision of the first dam DAM1 and the second dam DAM2 as illustrated in FIG. 9.

At least one of the first dam DAM1 and the second dam DAM2 can have a single layer or multilayer structure. For example, at least one of the first dam DAM1 and the second dam DAM2 can be simultaneously made of the same material as at least one of the banks BANK and spacers (not shown). In this case, a dam structure can be provided without additional mask processing or an increase in cost.

In addition, as illustrated in FIG. 9, at least one of the first dam DAM1 and the second dam DAM2 can have a structure in which at least one of the first inorganic encapsulation layer PAS1 and the second inorganic encapsulation layer PAS2 is stacked on the banks BANK.

In addition, the organic encapsulation layer PCL containing an organic material can be located on an inner side of the first dam DAM1, as illustrated in FIG. 9.

Alternatively, the organic encapsulation layer PCL containing an organic material can be located above at least a portion of the first dam DAM1 and the second dam DAM2. For example, the organic encapsulation layer PCL can be located above the first dam DAM1.

The second inorganic encapsulation layer PAS2 can be provided on the substrate SUB on which the organic encapsulation layer PCL is provided, so as to cover the top surfaces and side surfaces of the organic encapsulation layer PCL and the first inorganic encapsulation layer PAS1. The second inorganic encapsulation layer PAS2 reduces or prevents external moisture or oxygen from penetrating the first inorganic encapsulation layer PAS1 or the organic encapsulation layer PCL. The second inorganic encapsulation layer PAS2 is made of, for example, an inorganic insulating material, such as SiNx, SiOx, SiON, or $Al_2O_3$.

A touch buffer film T-BUF can be provided on the encapsulation layer ENCAP. The touch buffer film T-BUF can be located between the touch sensor metal TSM, including the X and Y-touch electrodes X-TE and Y-TE and X and Y-touch electrode connecting lines X-CL and Y-CL, and the second electrode E2 of the emitting device ED.

The touch buffer film T-BUF can be designed to maintain a predetermined minimum distance (e.g., 1 μm) between the touch sensor metal TSM and the second electrode E2 of the emitting device ED. Accordingly, this can reduce or prevent parasitic capacitance generated between the touch sensor metal TSM and the second electrode E2 of the emitting device ED, thereby preventing touch sensitivity from being reduced by the parasitic capacitance.

Without the touch buffer film T-BUF, the touch sensor metal TSM comprising the X and Y-touch electrodes X-TE and Y-TE and the X and Y-touch electrode connecting lines X-CL and Y-CL can be disposed on the encapsulation layer ENCAP.

In addition, the touch buffer film T-BUF can prevent or reduce the emitting layer EL containing the organic material from being penetrated by a chemical agent (e.g. a developing solution or an etching solution) used in fabrication processing of the touch sensor metal TSM disposed on the touch buffer film T-BUF, external moisture, or the like. Accordingly, the touch buffer film T-BUF can prevent the emitting layer EL vulnerable to the chemical agent or moisture from being damaged.

The touch buffer film T-BUF is made of an organic insulating material producible at a low temperature equal to or lower than a predetermined temperature (e.g., 100° C.) and having a low dielectric constant of 1 to 3 in order to prevent or reduce the emitting layer EL containing the organic material vulnerable to high temperature from being damaged. For example, the touch buffer film T-BUF can be made of an epoxy-based material or a siloxane-based material. The touch buffer film T-BUF made of an inorganic insulating material and having a planarization performance can prevent the layers PAS1, PCL, and PAS2 included in the encapsulation layer ENCAP from being damaged or the touch sensor metal TSM on the touch buffer film T-BUF from being fractured in response to the bending of the OLED display device.

According to the mutual capacitance-based touch sensor structure, the X-touch electrode lines X-TEL and the Y-touch electrode lines Y-TEL are disposed on the touch buffer film T-BUF, and the X-touch electrode lines X-TEL and the Y-touch electrode lines Y-TEL can be disposed such that the X-touch electrode lines X-TEL intersect the Y-touch electrode lines Y-TEL.

The Y-touch electrode lines Y-TEL can comprise the plurality of Y-touch electrodes Y-TE and the plurality of Y-touch electrode connecting lines Y-CL electrically connecting the plurality of Y-touch electrodes Y-TE.

As illustrated in FIG. 9, the plurality of Y-touch electrodes Y-TE and the plurality of Y-touch electrode connecting lines Y-CL can be disposed on different layers, on both sides of a touch insulating film T-ILD.

The plurality of Y-touch electrodes Y-TE can be spaced apart from each other by predetermined distances in the Y-axis direction. Each of the plurality of Y-touch electrodes Y-TE can be electrically connected to the other adjacent Y-touch electrodes Y-TE through the Y-touch electrode connecting lines Y-CL in the Y-axis direction.

The Y-touch electrode connecting lines Y-CL can be provided on the touch buffer film T-BUF and exposed through touch contact holes extending through the touch insulating film T-ILD to be electrically connected to the two adjacent Y-touch electrodes Y-TE in the Y-axis direction.

The Y-touch electrode connecting lines Y-CL can be disposed to overlap the banks BANK. Accordingly, the aperture ratio can be prevented from being decreased by the Y-touch electrode connecting lines Y-CL.

The X-touch electrode lines X-TEL can comprise the plurality of X-touch electrodes X-TE and the plurality of X-touch electrode connecting lines X-CL electrically connecting the plurality of X-touch electrodes X-TE. The plurality of X-touch electrodes X-TE and the plurality of X-touch electrode connecting line X-CL can be disposed on different layers, on both sides of the touch insulating film T-ILD.

The plurality of X-touch electrodes X-TE can be disposed on the touch insulating film T-ILD, spaced apart from each other by predetermined distances in the X-axis direction. Each of the plurality of X-touch electrodes X-TE can be electrically connected to the adjacent other X-touch electrodes X-TE through the X-touch electrode connecting lines X-CL in the X-axis direction.

The X-touch electrode connecting lines X-CL can be disposed on the same plane as the X-touch electrodes X-TE to be electrically connected to the two adjacent X-touch electrodes X-TE in the X-axis direction without separate contact holes or be integrated with the two adjacent X-touch electrodes X-TE in the X-axis direction.

The X-touch electrode connecting lines X-CL can be disposed to overlap the banks BANK. Accordingly, the aperture ratio can be prevented from being decreased by the X-touch electrode connecting lines X-CL.

In addition, the Y-touch electrode lines Y-TEL can be electrically connected to the touch driving circuit TDC through the Y-touch routing lines Y-TL and the Y-touch pads Y-TP. In the same manner, the X-touch electrode lines X-TEL can be electrically connected to the touch driving circuit TDC through the X-touch routing lines X-TL and the X-touch pads X-TP.

A pad cover electrode covering the X-touch pads X-TP and the Y-touch pads Y-TP can be further disposed.

The X-touch pads X-TP can be provided separately from the X-touch routing lines X-TL or be provided as extensions of the X-touch routing lines X-TL. The Y-touch pads Y-TP can be provided separately from the Y-touch routing lines Y-TL or be provided as extensions of the Y-touch routing lines Y-TL.

In a case in which the X-touch pads X-TP are extensions of the X-touch routing lines X-TL and the Y-touch pads Y-TP are extensions of the Y-touch routing lines Y-TL, the X-touch pads X-TP, the X-touch routing lines X-TL, the Y-touch pads Y-TP, and the Y-touch routing lines Y-TL can be comprised of the same material, i.e. a first conductive material. The first conductive material can have a single or multilayer structure made of a metal, such as Al, Ti, Cu, or Mo, having high corrosion resistance, high acid resistance, and high conductivity.

For example, each of the X-touch pads X-TP, the X-touch routing lines X-TL, the Y-touch pads Y-TP, and the Y-touch routing lines Y-TL comprised of the first conductive material can have a three-layer structure, such as Ti/Al/Ti or Mo/Al/Mo.

The pad cover electrode capable of covering the X-touch pads X-TP and the Y-touch pads Y-TP can be comprised of the same material as the X and Y-touch electrodes X-TE and Y-TE, i.e. a second conductive material. The second conductive material can be a transparent conductive material, such as indium tin oxide (ITO) or indium zinc oxide (IZO), having high corrosion resistance and acid resistance. The pad cover electrodes can be provided to be exposed from the touch buffer film T-BUF so as to be bonded to the touch driving circuit TDC or to a circuit film on which the touch driving circuit TDC is mounted.

The touch buffer film T-BUF can be provided to cover the touch sensor metal TSM so as to prevent or reduce the touch sensor metal TSM from being corroded by external moisture. For example, the touch buffer film T-BUF can be made of an organic insulating material or be provided as a circular polarizer or a film made of an epoxy or acrylic material. The touch buffer film T-BUF may not be provided on the encapsulation layer ENCAP. That is, the touch buffer film T-BUF may not be an essential component.

The Y-touch routing lines Y-TL can be electrically connected to the Y-touch electrodes Y-TE via touch routing line contact holes or be integrated with the Y-touch electrodes Y-TE.

Each of the Y-touch routing lines Y-TL can extend to the non-active area NA, past the top and side portions of the encapsulation layer ENCAP and the dams DAM, so as to be electrically connected to the Y-touch pads Y-TP. Accordingly, the Y-touch routing lines Y-TL can be electrically connected to the touch driving circuit TDC through the Y-touch pads Y-TP.

The Y-touch routing lines Y-TL can deliver the touch-sensing signal from the Y-touch electrodes Y-TE to the touch driving circuit TDC or deliver the touch driving signal, received from the touch driving circuit TDC, to the Y-touch electrodes Y-TE.

The X-touch routing lines X-TL can be electrically connected to the X-touch electrodes X-TE via the touch routing line contact holes or be integrated with the X-touch electrodes X-TE.

The X-touch routing lines X-TL can extend to the non-active area NA, past the top and side portions of the encapsulation layer ENCAP and the dams DAM, so as to be electrically connected to the X-touch pads Y-TP. Accordingly, the X-touch routing lines X-TL can be electrically connected to the touch driving circuit TDC through the X-touch pads X-TP.

The X-touch routing lines X-TL can deliver the touch driving signal, received from the touch driving circuit TDC, to the X-touch electrodes X-TE or deliver touch-sensing signal from the X-touch electrodes X-TE to the touch driving circuit TDC.

The arrangement of the X-touch routing lines X-TL and the Y-touch routing lines Y-TL can be modified variously depending on the design specification of the panel.

A touch protective film PAC can be disposed on the X-touch electrodes X-TE and the Y-touch electrodes Y-TE. The touch protective film PAC can extend to an area in front of or behind the dams DAM so as to be disposed on the X-touch routing lines X-TL and the Y-touch routing lines Y-TL.

The cross-sectional diagram of FIG. 9 is conceptual illustration of the structure. The positions, thicknesses, or widths of the patterns (e.g., various layers or electrodes) can vary depending on the direction or position of view, the structures for connecting the patterns can be modified, additional layers other than the plurality of illustrated layers can be further provided, and some of the plurality of illustrated layers can be omitted or integrated. For example, the width of the banks BANK can be narrower than that illustrated in the drawings, and the height of the dams DAM can be lower or higher than that illustrated in the drawings. In addition, the cross-sectional diagram of FIG. 9 illustrates a structure in which the touch electrode TE, the touch routing lines TL, and the like are disposed on the entirety of the subpixels SP in order to illustrate a structure connected to the touch pads TP along inclines of the touch routing lines TL and the encapsulation layer ENCAP. However, in a case in which the touch electrode TE or the like is mesh-shaped as described above, the open areas OA of the touch electrode TE can be located above the emitting areas of the subpixels SP. In addition, a color filter CF (see FIGS. 10 and 11) can be further disposed on the encapsulation layer ENCAP. The color filter CF can be located on the touch electrode TE or between the encapsulation layer ENCAP and the touch electrode TE.

Figure 10:
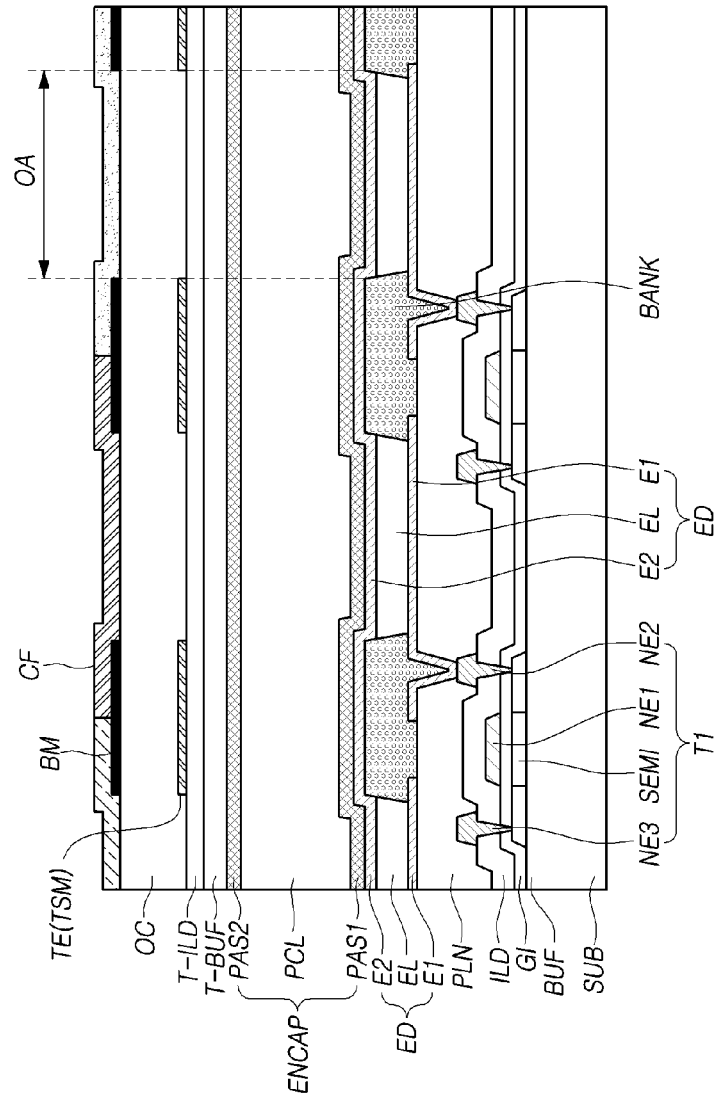
FIGS. 10 and 11 are diagrams illustrating a cross-sectional structure of a display panel including a color filter according to embodiments of the present disclosure.
Figure 11:
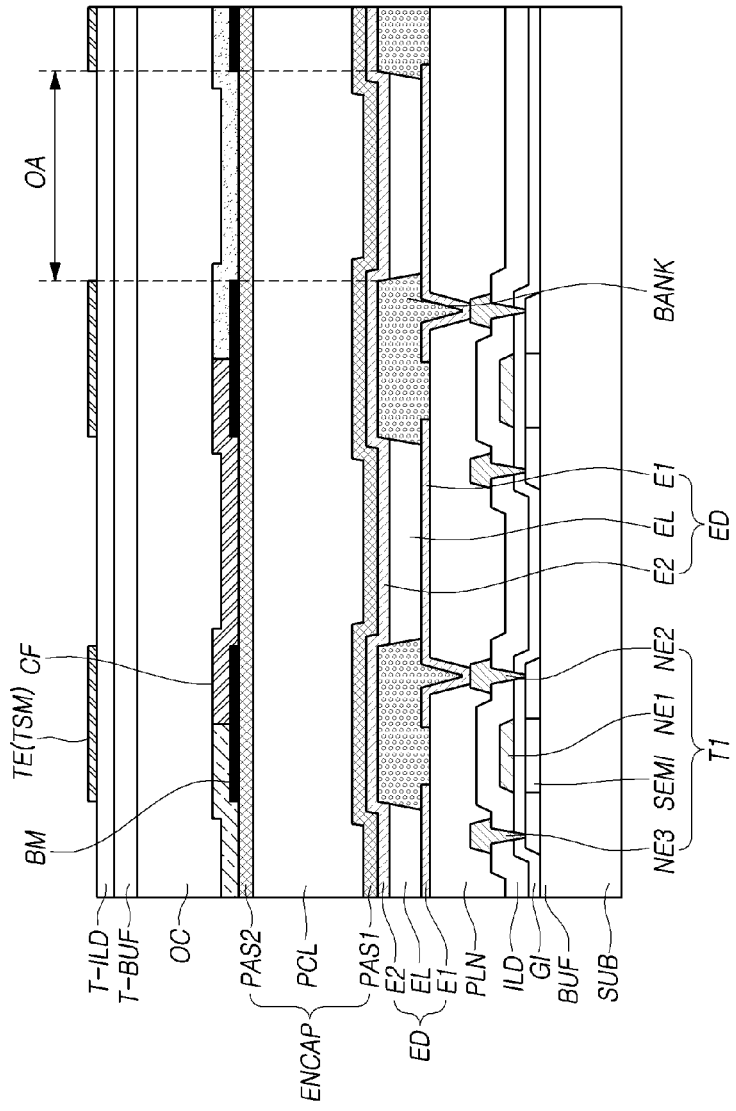

FIGS. 10 and 11 are diagrams illustrating a cross-sectional structure of the display panel DISP including the color filter CF according to embodiments of the present disclosure.

Referring to FIGS. 10 and 11, in a case in which the touch panel TSP is disposed within the display panel DISP and the display panel DISP is provided as an OLED display panel, the touch panel TSP can be located on the encapsulation layer ENCAP in the display panel DISP. That is, the touch sensor metals TSM, such as the plurality of touch electrodes TE and the plurality of touch routing lines TL, can be located on the encapsulation layer ENCAP in the display panel DISP.

The touch electrode TE being provided on the encapsulation layer ENCAP as described above can be made as the touch electrode TE without significantly influencing the display performance or the formation of a display-related layer.

Referring to FIGS. 10 and 11, the second electrode E2 that can be the cathode of the OLED can be located below the encapsulation layer ENCAP.

The thickness T of the encapsulation layer ENCAP can be, for example, 1 μm or more.

Since the thickness of the encapsulation layer ENCAP is designed to be 1 μm or more as described above, parasitic capacitance generated between the second electrode E2 and the touch electrodes TE of the OLED can be reduced, thereby preventing or reducing reduction of touch sensitivity by the parasitic capacitance.

As described above, each of the plurality of touch electrodes TE is patterned in the shape of a mesh, in which the electrode metal EM has two or more open areas OA. Each of the two or more open areas OA can correspond to one or more subpixels or the emitting areas thereof when viewed in a vertical direction.

As described above, the electrode metal EM of the touch electrode TE can be patterned such that the emitting area of one or more subpixels SP is provided in a position corresponding to each of the two or more open areas OA present in the area of the touch electrode TE when viewed in a plan view. Accordingly, the luminous efficiency of the display panel DISP can be improved.

As illustrated in FIGS. 10 and 11, a black matrix BM can be provided in the display panel DISP. The color filter CF can be further provided in the display panel DISP.

The position of the black matrix BM can correspond to the position of the electrode metal EM of the touch electrode TE.

The positions of the plurality of color filters CF correspond to the positions of the plurality of touch electrodes TE or the position of the electrode metal EM constituting the plurality of touch electrodes TE.

Since the plurality of color filters CF are located in positions corresponding to the plurality of open areas OA as described above, the luminous performance of the display panel DISP can be improved.

The vertical positional relationship between the plurality of color filters CF and the plurality of touch electrodes TE will be described as follows.

As illustrated in FIG. 10, the plurality of color filters CF and the black matrix BM can be located on the plurality of touch electrodes TE.

In this case, the plurality of color filters CF and the black matrix BM can be located on the overcoat layer OC disposed on the plurality of touch electrodes TE. Here, the overcoat layer OC can be the same layer as or a different layer from the touch protective film PAC illustrated in FIG. 9.

Alternatively, as illustrated in FIG. 11, the plurality of color filters CF and the black matrix BM can be located below the plurality of touch electrodes TE.

In this case, the plurality of touch electrodes TE can be located on the overcoat layer OC on the plurality of color filters CF and the black matrix BM. The overcoat layer OC can be the same layer as or a different layer from the touch buffer film T-BUF or the touch insulating film T-ILD illustrated in FIG. 9. Alternatively, the touch buffer film T-BUF or the touch insulating film T-ILD can be disposed in a manner separate from the overcoat layer OC.

Due to the vertical positional relationship between the touch electrode TE and a display driving configuration being adjusted as described above, a touch sensing configuration can be disposed without degrading the display performance.

Meanwhile, as a size of the touch display device increases, a number and an area of the touch electrode line TEL disposed in the display panel DISP can increase. And also, a number and a length of the touch routing line TL connected to the touch electrode line TEL can increase.

An increase of the area of the touch electrode line TEL and an increase of the length of the touch routing line TL can lead an increase of a load, and a performance of a touch sensing can be dropped since a sensitivity of a touch sensing signal is dropped due to an increase of the load.

According to embodiments of the present disclosure, by connecting two or more touch routing lines TL to one touch electrode line TEL, the load can be reduced and the sensitivity of the touch sensing signal can be enhanced.

Figure 12:
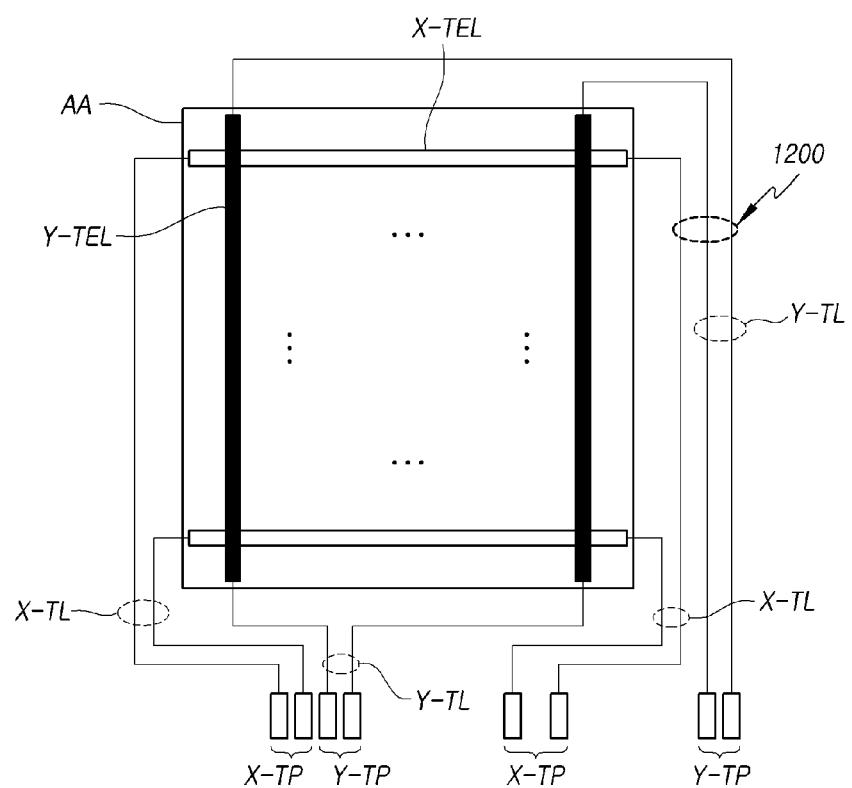
FIG. 12 is a diagram illustrating an example of a planar structure that a touch routing line is disposed in a display panel according to embodiments of the present disclosure.

FIG. 12 is a diagram illustrating an example of a planar structure that the touch routing line TL is disposed in the display panel DISP according to embodiments of the present disclosure.

Referring to FIG. 12, the plurality of X-touch electrode lines X-TEL and the plurality of Y-touch electrode lines Y-TEL can be disposed on the active area AA of the display panel DISP. Each of the plurality of X-touch electrode lines X-TEL can be electrically connected to two X-touch routing lines X-TL, and each of the plurality of Y-touch electrode lines Y-TEL can be electrically connected to two Y-touch routing lines Y-TL.

For example, such as an example illustrated in FIG. 12, the X-touch routing line X-TL can be connected to both sides (left side, right side) of the X-touch electrode line X-TEL. And the Y-touch routing line Y-TL can be connected to both sides (upper side, lower side) of the Y-touch electrode line Y-TEL.

As described above, by supplying the touch driving signal and receiving the touch sensing signal through the plurality of touch routing line TL connected to both sides of one touch electrode line TEL, the load can be reduced and the sensitivity of the touch sensing can be enhanced.

In this manner, the load can be reduced by a structure that the touch routing line TL is connected to both sides of the touch electrode line TEL, but a number of the touch routing line TL disposed on the non-active area NA can increase.

Thus, the non-active area NA required for arranging the touch routing line TL can increase due to an increase of a number of the touch routing line TL.

Specifically, in the example illustrated in FIG. 12, such as a portion indicated by 1200, as all of the X-touch routing line X-TL and the Y-touch routing line Y-T are disposed on the non-active area NA located on a right side of the active area AA, an area required for arranging the touch routing line TL can increase.

According to embodiments of the present disclosure, a method can be provided to reduce the area required for arranging the touch routing line TL, by making a few of the plurality of touch routing lines TL or a portion of each of the plurality of touch routing lines TL disposed on the non-active area NA using a metal used as a display signal line.

That is, according to embodiments of the present disclosure, a method can be provided to prevent or reduce an increase of the non-active area NA due to an arrangement of the touch routing line TL while reducing the load of the touch routing line TL.

Figure 13:
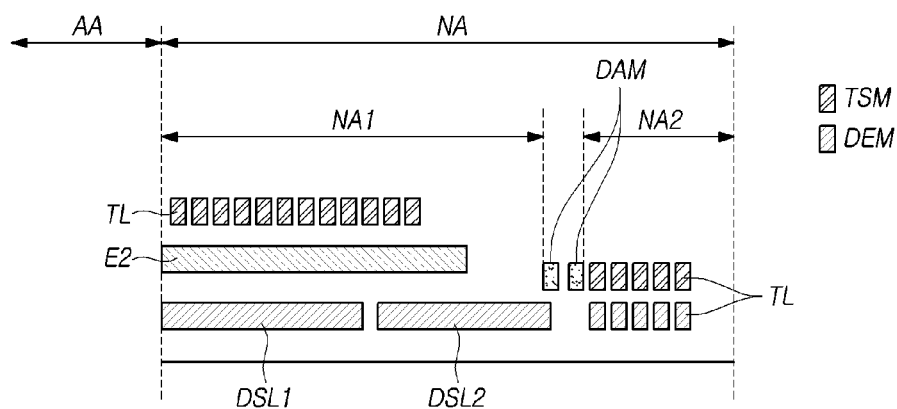
FIG. 13 is a diagram schematically illustrating an example of a cross-sectional structure that the touch routing line shown in FIG. 12 is disposed according to an embodiment of the present disclosure.

FIG. 13 is a diagram schematically illustrating an example of a cross-sectional structure that the touch routing line TL shown in FIG. 12 is disposed, and exemplarily illustrates a cross-sectional structure of a portion indicated by 1200 in FIG. 12 according to one embodiment.

Referring to FIG. 13, a display signal line DSL supplying a signal or a voltage for the display driving can be disposed on the non-active area NA of the display panel DISP.

For example, a first display signal line DSL1 can be disposed to be adjacent a boundary of the active area AA, and the first display signal line DSL1 can constitute the gate driver GDC, or supply a signal to the gate driver GDC. A second display signal line DSL2 can be disposed outside of the first display signal line DSL1, and the second display signal line DSL2 can supply a voltage (e.g., ground, base voltage) for the display driving.

The display signal line DSL can be made of a display electrode metal DEM.

The display electrode metal DEM is a metal used for implementing an element or a line, or the like for the display driving, for example, can be a metal used for constituting a gate electrode or a source/drain electrode of a transistor. Alternatively, the display electrode metal DEM can be a metal used for constituting a line for supplying a signal or a voltage for the display driving. Alternatively, besides these, the display electrode metal DEM can mean one of an electrode material disposed for the display driving.

The display signal line DSL made of the display electrode metal DEM can be located inside the dam DAM. That is, the display signal line DSL can be located under the encapsulation layer ENCAP.

The second electrode E2 can be disposed on the display signal line DSL. Here, the second electrode E2 disposed on the non-active area NA, for example, can be made of a same material as a material constituting the first electrode E1 in the active area AA.

The encapsulation layer ENCAP can be disposed on the second electrode E2. The touch routing line TL made of the touch sensor metal TSM can be disposed on the encapsulation layer ENCAP.

Here, the touch routing line TL can be disposed inside the dam DAM or outside the dam DAM in the non-active area NA. Furthermore, the touch routing line TL can be disposed on both of inside and outside the dam DAM.

For example, when an area between the boundary of the active area AA and the dam DAM in the non-active area NA is referred to as a first non-active area NA1 and an area outside the dam DAM is referred to as a second non-active area NA2, the touch routing line TL can be disposed on at least a part area of the first non-active area NA1 and the second non-active area NA2.

At least one or a portion of the touch routing line TL disposed on the second non-active area NA2 can be made of the display electrode metal DEM used for making the display signal line DSL.

That is, the display signal line DSL may not be disposed on the second non-active area NA2 located outside the dam DAM in the non-active area NA except for a pad area or the like. Thus, the touch routing line TL can be disposed on the second non-active area NA2 where the display signal line DSL isn't disposed using the display electrode metal DEM.

For example, such as the example illustrated in FIG. 13, the touch routing line TL made of the touch sensor metal TSM can be disposed on the encapsulation layer ENCAP in the first non-active area NA1 of the non-active area NA. And at least one of the touch routing ling TL made of the touch sensor metal TSM and the touch routing line TL made of the display electrode metal DEM can be disposed on the second non-active area NA2 of the non-active area NA.

In a case that both of the touch routing line TL made of the touch sensor metal TSM and the touch routing line TL made of the display electrode metal DEM is disposed on the second non-active area NA2, the insulating layer ILD can be disposed between the touch routing lines TL made of different metals.

Since the touch routing line TL made of the touch sensor metal TSM and the touch routing line TL made of the display electrode metal DEM can be disposed on different layers, the touch routing line TL can be disposed while reducing a width of the second non-active area NA2.

Alternatively, as the touch routing line TL disposed on the second non-active area NA2 is made by electrically connecting the touch sensor metal TSM and the display electrode metal DEM each other, a resistance of the touch routing line TL can be reduced. That is, a load of the touch routing line TL can be reduced by reducing the resistance of the touch routing line TL while maintaining an entire width of the non-active area NA.

Furthermore, in a case that the touch routing line TL is made by connecting the touch sensor metal TSM and the display electrode metal DEM each other, a width of the touch routing line TL can be reduced since the resistance of the touch routing line TL decrease. Thus, the non-active area NA can be reduced while reducing the resistance of the touch routing line TL.

As described above, as disposing the touch routing line TL using the display electrode metal DEM on an area where the display signal line DSL isn't disposed on the non-active area NA, a width of the non-active area NA can be reduced, in some cases, the resistance of the touch routing line TL can be reduced.

Alternatively, in some cases, by disposing a portion of the touch routing line TL made of the display electrode metal DEM inside the dam DAM, the non-active area NA can be further reduced.

Figure 14:
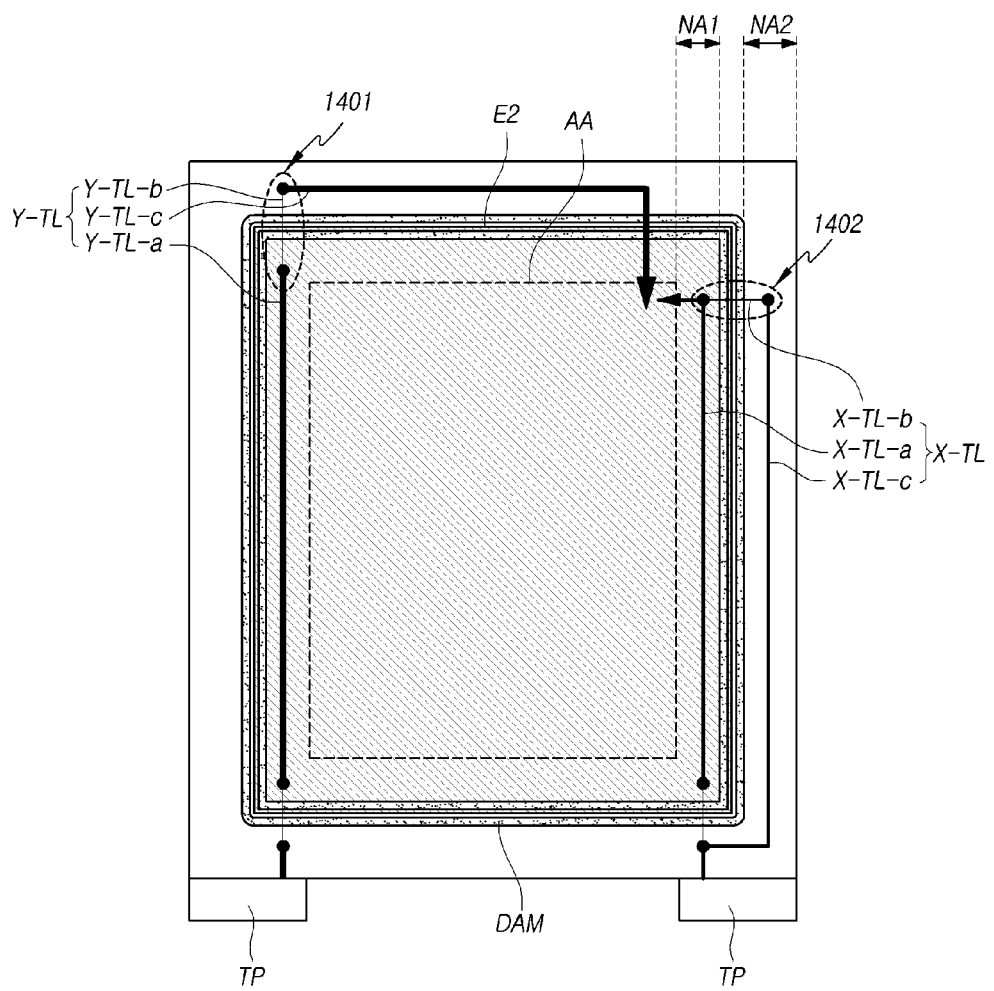
FIG. 14 is a diagram illustrating another example of a planar structure that a touch routing line is disposed in a display panel according to embodiments of the present disclosure.

FIG. 14 is a diagram illustrating another example of a planar structure that the touch routing line TL is disposed in the display panel DISP according to embodiments of the present disclosure.

Figure 15:
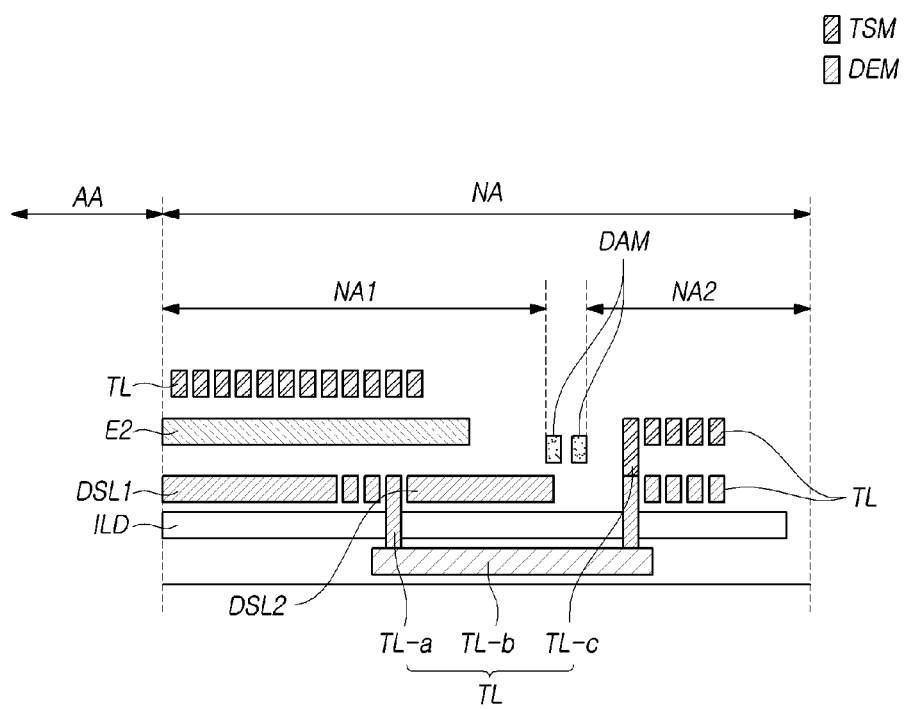
FIGS. 15 and 16 are diagrams schematically illustrating an example of a cross-sectional structure that the touch routing line shown in FIG. 14 is disposed according to an embodiment of the present disclosure.
Figure 16:
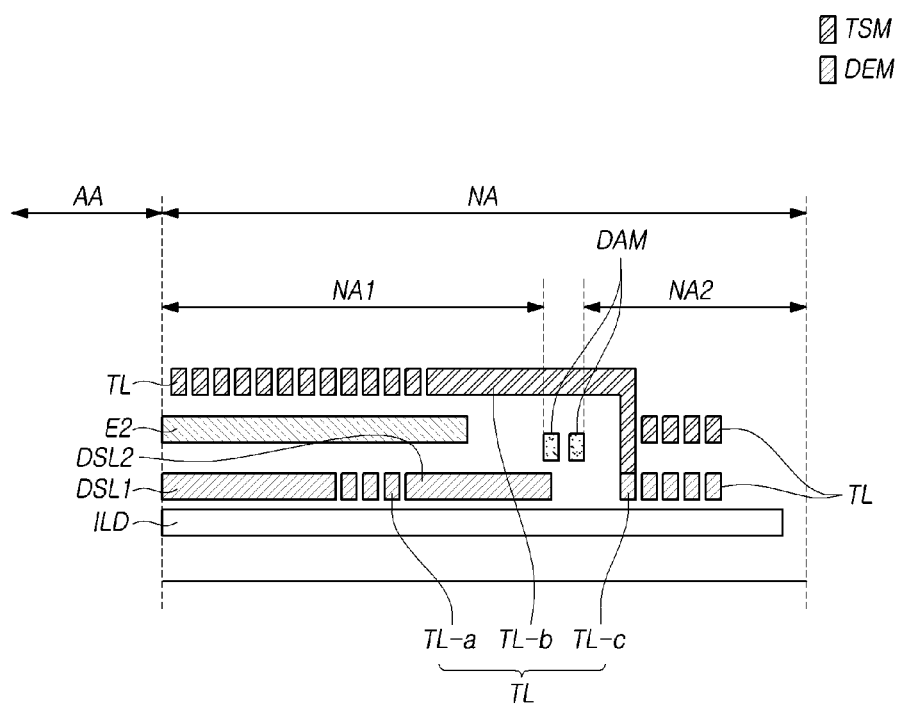

FIGS. 15 and 16 are diagrams schematically illustrating an example of a cross-sectional structure that the touch routing line TL shown in FIG. 14 is disposed, FIG. 15 illustrates schematically an example of a cross-sectional structure of a portion indicated by 1401 shown in FIG. 14, and FIG. 16 illustrates schematically a cross-sectional structure of a portion indicated by 1402 shown in FIG. 14.

Referring to FIGS. 14 and 15, the plurality of touch routing line TL disposed on the non-active area NA of the display panel DISP can be made of at least one of the touch sensor metal TSM and the display electrode metal DEM. And at least one of the plurality of touch routing line TL can comprise a portion made of the display electrode metal DEM on the first non-active area NA1 between the boundary of the active area AA and the dam DAM.

For example, referring to the Y-touch routing line Y-TL exemplarily illustrated in FIG. 14, the Y-touch routing line Y-TL can comprise a first part Y-TL-a made of the display electrode metal DEM located under the encapsulation layer ENCAP in the first non-active area NA1.

The first part Y-TL-a of the Y-touch routing line Y-TL can be disposed between the display signal line DSL located outmost in the first non-active area NA1 and the dam DAM.

Alternatively, such as the example illustrated in FIG. 15, the first part Y-TL-a of the Y-touch routing line TL can be located between the first display signal line DSL1 and the second display signal line DSL2.

The first part Y-TL-a of the Y-touch routing line Y-TL can be connected to a second part Y-TL-b of the Y-touch routing line Y-TL located under the dam DAM. The first part Y-TL-a and the second part Y-TL-b of the Y-touch routing line Y-TL can be directly connected, or can be connected through other electrode material.

The second part Y-TL-b of the Y-touch routing line Y-TL can be made of the display electrode metal DEM, or can be made of a metal disposed separate from the display electrode metal DEM for making the touch routing line TL.

The second part Y-TL-b of the Y-touch routing line Y-TL can be connected to a third part Y-TL-c of the Y-touch routing line Y-TL made of the touch sensor metal TSM on the second non-active area NA2 which is an area outside the dam DAM. The second part Y-TL-b and the third part Y-TL-c of the Y-touch routing line Y-TL can be directly connected, or can be connected through other electrode material.

The third part Y-TL-c of the Y-touch routing line Y-TL can be disposed while passing on the dam DAM. And the third prat Y-TL-c of the Y-touch routing line Y-TL can be electrically connected to the touch electrode line TEL located on the encapsulation layer ENCAP and disposed on the active area AA.

As described above, a portion of the touch routing line TL can be made by using the display electrode metal DEM disposed under the encapsulation layer ENCAP in the first non-active area NA1.

Thus, a number of the touch routing line TL made of the display electrode metal DEM on the second non-active area NA2 can be reduced. And an area required due to a disposition of the insulating layer ILD in a case that the touch routing line TL made of the display electrode metal DEM is disposed can be reduced.

Furthermore, a portion of the touch routing line TL located under the encapsulation layer ENCAP can be connected to the touch electrode line TEL located on the encapsulation layer ENCAP through a metal located under the dam DAM.

Thus, even if a portion of the touch routing line TL is disposed under the encapsulation layer ENCAP, an advantage can be provided that a hole is not necessary to be made in the encapsulation layer ENCAP for electrically connecting between the touch routing line TL and the touch electrode line TEL.

As disposing the touch routing line TL using the display electrode metal DEM, a spare space can be made in the non-active area NA, in this case, the resistance of the touch routing line TL can be reduced by connecting two or more touch routing line TL each other.

Specifically, as the non-active area NA of the display panel DISP is made symmetrically, among both sides of the active area AA, a structure where two or more touch routing line TL are connected to each other can be made in a side that the spare space is generated due to a reduction of a space for disposing the touch routing line TL.

For example, referring to the X-touch routing line X-TL exemplarily illustrated in FIG. 14 and FIG. 16, the first part X-TL-a of the X-touch routing line X-TL can be disposed under the encapsulation layer ENCAP in the first non-active area NAL And the third part X-TL-c of the X-touch routing line X-TL can be disposed on the second non-active area NA2, and can be made of at least one of the touch sensor metal TSM and the display electrode metal DEM.

The third part X-TL-c of the X-touch routing line X-TL can be disposed on the dam DAM and connected to the second part X-TL-b made of the touch sensor metal TSM. Here, the second part X-TL-b of the X-touch routing line X-TL can be overlapped with the first part X-TL-a and connected to the touch sensor metal TSM disposed on the encapsulation layer ENCAP.

That is, in the example illustrated in FIG. 14, the X-touch routing line X-TL of a rectangular shape can be made by using at least a portion of the touch sensor metal TSM and the display electrode metal DEM.

In a case that a spare space is present in the non-active area NA as making a portion of the touch routing line TL by using the display electrode metal DEM, the resistance of the touch routing line TL can be reduced as making the touch routing line TL by connecting two or more adjacent metals each other.

As described above, according to embodiments of the present disclosure, as making the touch routing line TL by using at least one of the touch sensor metal TSM located on the encapsulation layer ENCAP, the touch sensor metal TSM located outside the dam DAM, the display electrode metal DEM located under the encapsulation layer ENCAP and the display electrode metal DEM located outside the dam DAM, the touch routing line TL can be disposed while reducing the non-active area NA.

Furthermore, using that the non-active area NA is reduced, in some cases, as making the touch routing line TL by connecting two or more metals, the resistance of the touch routing line TL can be reduced.

Meanwhile, as a portion of the touch routing line TL is disposed under the encapsulation layer ENCAP, a parasitic capacitance formed between the touch routing line TL and a display electrode located under the encapsulation layer ENCAP or the like can increase.

According to embodiments of the present disclosure, methods can be provided that the load of the touch routing line TL can be reduced while reducing the non-active area NA by disposing the touch routing line TL under the encapsulation layer ENCAP.

Figure 17:
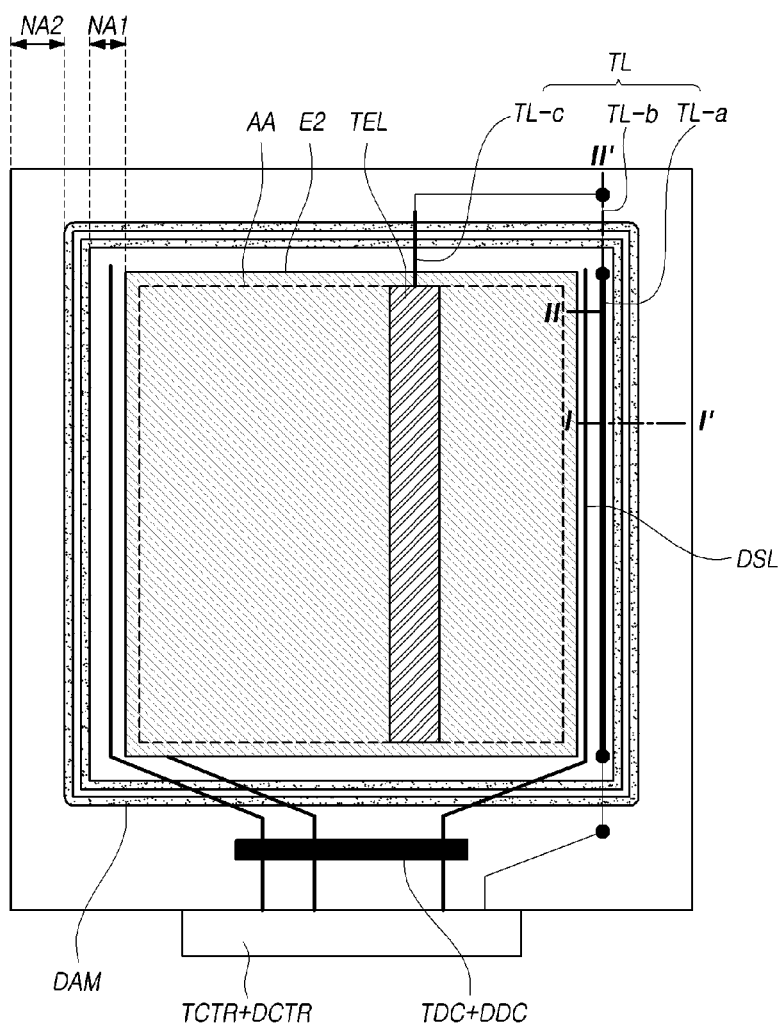
FIG. 17 is a diagram illustrating another example of a planar structure that a touch routing line is disposed in a display panel according to embodiments of the present disclosure.

FIG. 17 is a diagram illustrating another example of a planar structure that the touch routing line TL is disposed in the display panel DISP according to embodiments of the present disclosure.

Figure 18:
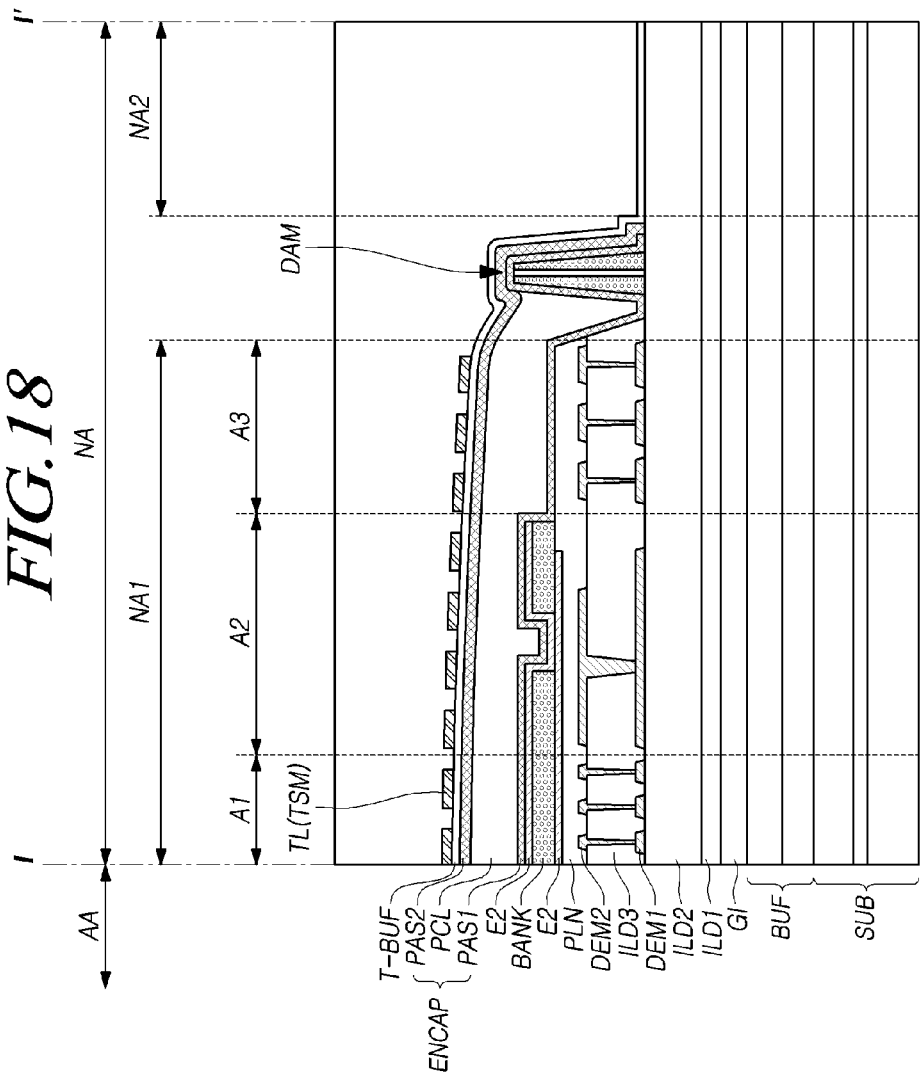
FIG. 18 is a diagram illustrating an example of a cross-sectional structure, taken along line I-I' in FIG. 17 according to an embodiment of the present disclosure.
Figure 19:
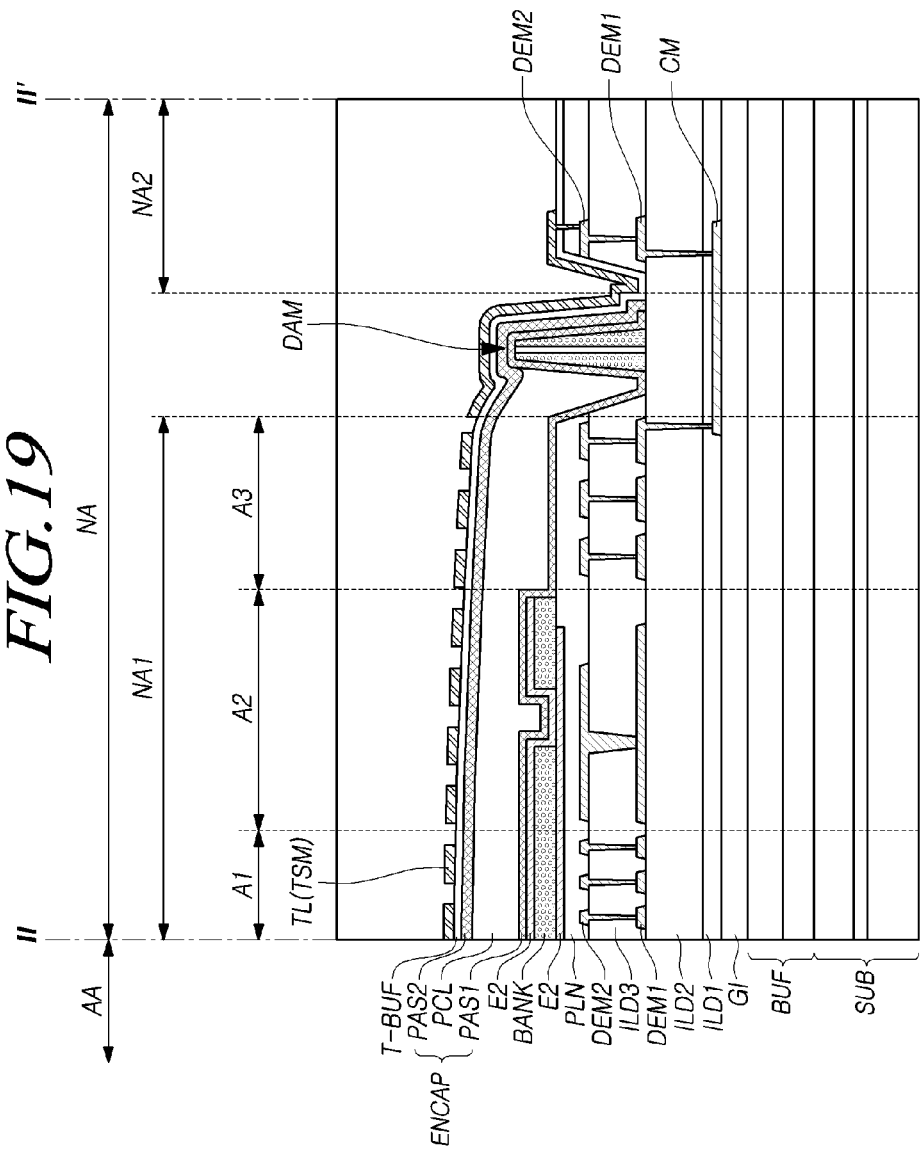
FIG. 19 is a diagram illustrating an example of a cross-sectional structure, taken along line II-II' in FIG. 17 according to an embodiment of the present disclosure.

FIG. 18 is a diagram illustrating an example of a cross-sectional structure, taken along line I-I' in FIG. 17, FIG. 19 is a diagram illustrating an example of a cross-sectional structure, taken along line II-II' in FIG. 17 according to one embodiment.

Referring to FIG. 17, the touch electrode line TEL can be disposed on the encapsulation layer ENCAP in the active area AA. The display signal line DSL can be disposed under the encapsulation layer ENCAP in the first non-active area NA1 between the boundary of the active area AA and the dam DAM in the non-active area NA of the display panel DISP. Furthermore, the touch routing line TL made of the display electrode metal DEM can be disposed under the encapsulation layer ENCAP in the first non-active area NA1.

The touch routing line TL, for example, can comprise a first part TL-a disposed under the encapsulation layer ENCAP in the first non-active area NA1, a second part TL-b connected to the first part TL-a and disposed under the dam DAM, and a third part TL-c connected to the second part TL-b, disposed on the dam DAM and connected to the touch electrode line TEL.

That is, the touch routing line TL comprising a portion disposed under the encapsulation layer ENCAP can be disposed to cross the dam DAM on at least two points. The touch routing line TL can be located under the dam DAM on at least one of the at least two points, and located on the dam DAM on at least one of the at least two points. A point that the touch routing line TL is disposed under the dam DAM can be same as or different from a point that the touch routing line TL is disposed on the dam DAM.

As described above, the touch routing line TL can be disposed under the encapsulation layer ENCAP in the first non-active area NA1, disposed under the dam DAM in the first non-active area NA1 and the second non-active area NA2, and extended toward the first active area NA1 from the second non-active area NA2 again to be disposed along an upper portion of the dam DAM and an inclined surface of the encapsulation layer ENCAP.

Thus, the touch routing line TL can be made by using the display electrode metal DEM located under the encapsulation layer ENCAP without making a hole in the encapsulation layer ENCAP.

Furthermore, as the touch routing line TL made of the display electrode metal DEM does not overlap with the display electrode in the first non-active area NA1, a load does not increase due to the parasitic capacitance between the display electrode and the touch routing line TL.

Looking at a cross-sectional view of the non-active area NA of the display panel DISP referring to FIG. 18, a buffer layer BUF can be disposed on the substrate SUB, and the gate insulating film GI and a plurality of insulating layers ILD1, ILD2, ILD3 can be disposed on the buffer layer BUF.

At least one display electrode metal DEM for constituting a line or the like for supplying a signal or a voltage for the display driving can be disposed. The example illustrated in FIG. 18 represents a case that a first display electrode metal DEM1 and a second display electrode metal DEM2 are used for the display signal line DSL, but a type or a number of the display electrode metal DEM can be various.

The planarization layer PLN can be disposed on the display electrode metal DEM, and the second electrode E2, the encapsulation layer ENCAP or the like can be disposed on the planarization layer PLN. And the touch routing line TL made of the touch sensor metal TSM can be disposed on the encapsulation layer ENCAP.

Here, a portion of the display electrode metal DEM disposed under the encapsulation layer ENCAP can constitute the display signal line DSL. Furthermore, another portion of the display electrode metal DEM disposed under the encapsulation layer ENCAP can constitute the touch routing line TL.

For example, the display electrode metal DEM disposed on a first area A1 of the non-active area NA which is most adjacent to the boundary of the active area AA can constitute the first display signal line DSL1. And the display electrode metal DEM disposed on a second area A2 located outside the first area A1 can constitute the second display signal line DSL2.

The display electrode metal DEM disposed on a third area A3 located outside the second area A2 can constitute the touch routing line TL.

That is, in the first non-active area NA1, the touch routing line TL made of the display electrode metal DEM can be disposed on an area where the display signal line DSL isn't disposed under the encapsulation layer ENCAP.

Thus, the touch routing line TL made of the touch sensor metal TSM can be disposed on the first area A1 and the second area A2, and the touch routing line TL made of the touch sensor metal TSM and the touch routing line TL made of the display electrode metal DEM can be disposed on the third area A3.

Furthermore, the touch routing line TL made of at least one of the touch sensor metal TSM and the display electrode metal DEM can be disposed on the second non-active area NA2 which is outside area of the dam DAM in the non-active area NA.

As described above, as constituting the touch routing line TL by using the touch sensor metal TSM and the display electrode metal DEM, an increase of the non-active area NA due to an arrangement of the touch routing line TL can be prevented and the load of the touch routing line TL can be reduced.

Here, the touch routing line TL disposed under the encapsulation layer ENCAP and made of the display electrode metal DEM can be located not to be overlapped with the second electrode E2 located under the encapsulation layer ENCAP.

Such as the example illustrated in FIG. 18, the second electrode E2 can be disposed on an area except for the third area A3.

As the second electrode E2 being supplied a voltage for the display driving isn't disposed on the touch routing line TL made of the display electrode metal DEM, an increase of the load due to the parasitic capacitance made between the touch routing line TL and the second electrode E2 can be prevented or reduced.

The second electrode E2 can be disposed on the display signal line DSL made of the display electrode metal DEM.

That is, such as the example illustrated in FIG. 18, the second electrode E2 can be disposed on the first area A1 and the second area A2, and can be disposed between the display signal line DSL made of the display electrode metal DEM and the touch routing line TL made of the touch sensor metal TSM.

The second electrode E2 can be disposed to be overlapped with at least a portion of at least one of the display signal line DSL made of the display electrode metal DEM and the touch routing line TL made of the touch sensor metal TSM.

Since the second electrode E2 being supplied a constant voltage for the display driving is disposed on the display signal line DSL, noise is not generated in the touch sensing signal detected through the touch routing line TL disposed on the encapsulation layer ENCAP by a signal supplied to the display signal line DSL.

As described above, by disposing the second electrode E2 disposed on the first non-active area NA1 only on the first area A1 and the second area A2, the second electrode E2 does not affect the touch routing line TL made of the touch sensor metal TSM on the encapsulation layer ENCAP and the touch routing line TL made of the display electrode metal DEM under the encapsulation layer ENCAP.

The touch routing line TL disposed under the encapsulation layer ENCAP can be connected to the touch electrode line TEL disposed on the encapsulation layer ENCAP through a metal located under the dam DAM.

Referring to FIG. 19, the touch routing line TL made of the display electrode metal DEM can be disposed under the encapsulation layer ENCAP in the third area A3.

The touch routing line TL made of the display electrode metal DEM can be electrically connected to a connecting metal CM located under the dam DAM inside the dam DAM. In this disclosure, the connecting metal CM can be referred to as "a connecting pattern".

The connecting metal CM can be electrically connected to the touch routing line TL made of the touch sensor metal TSM outside the dam DAM.

Here, the connecting metal CM can be one of the display electrode metal DEM, for example, can be a metal used for making a gate electrode of a transistor. Alternatively, the connecting metal CM can be a metal disposed separate from the display electrode metal DEM for making the touch routing metal TL.

As a portion of the touch routing line TL located under the encapsulation layer ENCAP is electrically connected to a portion of the touch routing line TL located on the encapsulation layer ENCAP through the connecting metal CM located under the dam DAM, the touch routing line TL made of the display electrode metal DEM under the encapsulation layer ENCAP can be electrically connected to the touch electrode line TEL disposed on the encapsulation layer ENCAP without making a hole in the encapsulation layer ENCAP.

Thus, a portion of the touch routing line TL made of the display electrode metal DEM can be disposed inside the dam DAM while maintaining a structure of the encapsulation layer ENCAP.

As described above, according to embodiments of the present disclosure, by disposing the touch routing line TL as various structures inside and outside the dam DAM using the display electrode metal DEM and the touch sensor metal TSM, the load of the touch routing line TL can be reduced while minimizing the non-active area NA.

A portion of the touch routing line TL located inside the dam DAM, in some cases, can be disposed by using at least one of the display electrode metal DEM and the touch sensor metal TSM.

For example, the touch routing line TL made of only the touch sensor metal TSM can be disposed on the encapsulation layer ENCAP inside the dam DAM. The touch routing line TL can be disposed on the encapsulation layer ENCAP to be connected to the touch electrode line TEL, can be located to be adjacent the boundary of the active area AA.

For another example, the touch routing line TL comprising a portion made of the display electrode metal DEM located under the encapsulation layer ENCAP can be disposed inside the dam DAM. The touch routing line TL can be made of one or more display electrode metal DEM. Furthermore, in some cases, the touch routing line TL can further comprise a portion made of the touch sensor metal TSM.

FIGS. 20A to 20F are diagrams illustrating examples of a cross-sectional structure that the touch routing line TL shown in FIG. 17 is disposed, and they illustrate examples that the touch routing line TL located inside the dam DAM constitutes variously according to one embodiment.

Figure 20A:
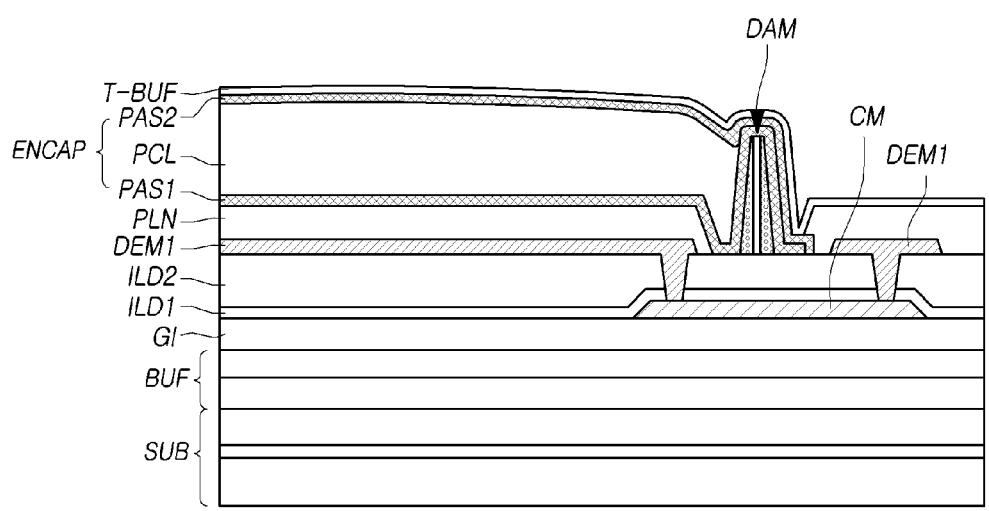
FIGS. 20A to 20F are diagrams illustrating examples of a cross-sectional structure that the touch routing line shown in FIG. 17 is disposed according to an embodiment of the present disclosure.

Referring to FIG. 20A, a portion of the touch routing line TL located between the boundary of the active area AA and the dam DAM can be made of the first display electrode metal DEM1. The portion of the touch routing line TL can constitute the touch routing line TL to be connected to the first display electrode metal DEM1 located outside the dam DAM through the connecting metal located under the dam DAM.

That is, the touch routing line TL can be implemented by using one display electrode metal DEM between the boundary of the active area AA and the dam DAM.

Alternatively, the touch routing line TL can be made by using both of the display electrode metal DEM and the touch sensor metal TSM for reducing the resistance of the touch routing line TL.

Figure 20B:
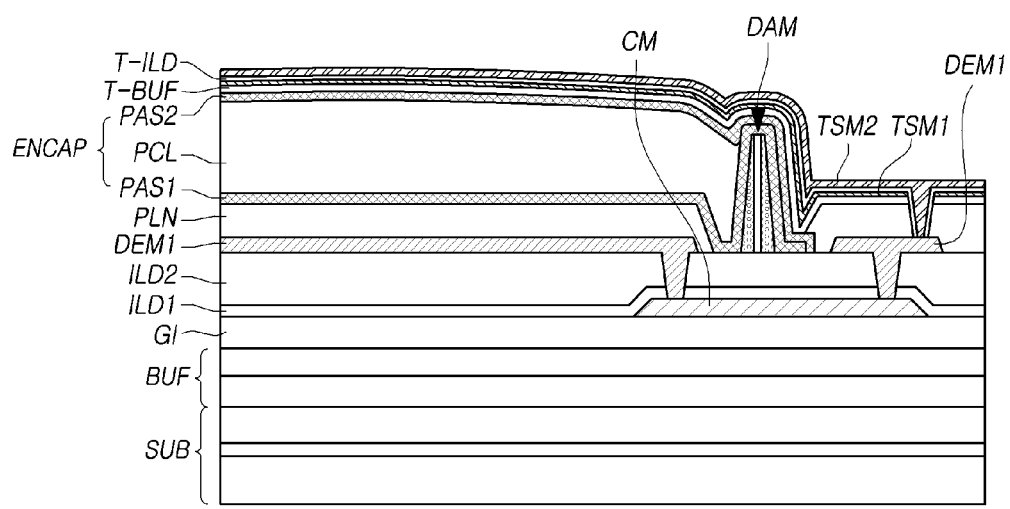
Figure 20C:
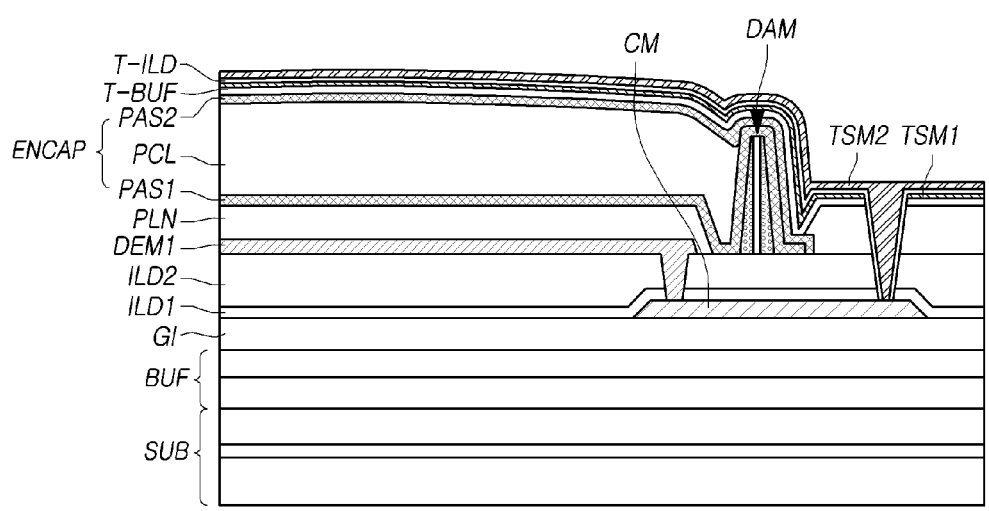

Referring to FIGS. 20B and 20C, the touch routing line TL can be made by the first display electrode metal DEM1 located under the encapsulation layer ENCAP between the boundary of the active area AA and the dam DAM.

Furthermore, the touch routing line TL can be made by at least one of a first touch sensor metal TSM1 and a second touch sensor metal TSM2 located on the encapsulation layer ENCAP.

The touch sensor metal TSM constituting the touch routing line TL and located on the encapsulation layer ENCAP can be overlapped with at least a portion of the first display electrode metal DEM1 constituting the touch routing line TL and located under the encapsulation layer ENCAP. The touch sensor metal TSM and the first display electrode metal DEM1 can be electrically connected to each other outside the dam DAM, and can constitute one touch routing line TL.

Here, the touch sensor metal TSM constituting the touch routing line TL can be electrically connected to the connecting metal CM through the first display electrode metal DEM1 such as an example illustrated in FIG. 20B. Alternatively, the touch sensor metal TSM constituting the touch routing line TL can be directly connected to the connecting metal CM such as an example illustrated in FIG. 20C.

In a case that the touch routing line TL is made by using the first display electrode metal DEM1 between the boundary of the active area AA and the dam DAM, the touch routing line TL having a double-layer structure can be made by using the touch sensor metal TSM located on the encapsulation layer ENCAP.

That is, the touch sensor metal TSM passing on the dam DAM and the display electrode metal DEM or the connecting metal CM passing under the dam DAM can be electrically connected to each other outside the dam DAM to constitute one touch routing line TL.

As the touch routing line TL is made as the double-layer, the resistance of the touch routing line TL can be reduced. Furthermore, a width of the touch routing line TL can be reduced since the resistance of the touch routing line TL is reduced.

Alternatively, the touch routing line TL having a multi-layer structure can be made by using two or more display electrode metal DEM located under the encapsulation layer ENCAP.

Figure 20D:
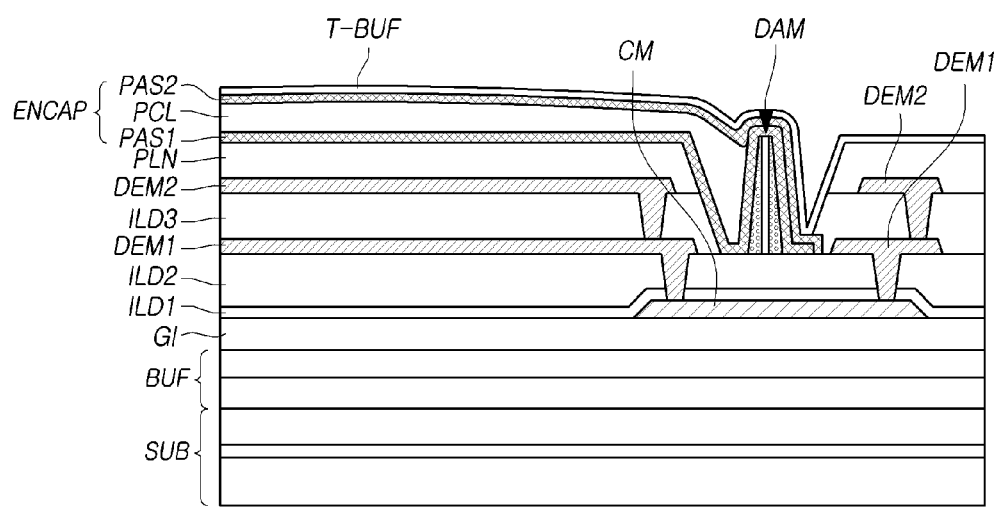

Referring to FIG. 20D, a portion of the touch routing line TL can be made by using the first display electrode metal DEM1 and the second display electrode metal DEM2 located under the encapsulation layer ENCAP.

In constituting the display signal line DSL or the like located under the encapsulation layer ENCAP, several display electrode metal DEM can be used for constituting various display signal line DSL or reducing a resistance of the display signal line DSL.

Thus, in a case that a plurality of display electrode metal DEM are located under the encapsulation layer ENCAP, as constituting the touch routing line TL by using two or more display electrode metal DEM, the resistance of the touch routing line TL can be reduced.

In this case, since other touch routing line TL can be made by using the touch sensor metal TSM on the encapsulation layer ENCAP, the touch routing line TL can be disposed easily while reducing the non-active area NA.

Alternatively, for reducing the resistance of the touch routing line TL more, one touch routing line TL can be made by using the touch sensor metal TSM located on the encapsulation layer ENCAP together.

Figure 20E:
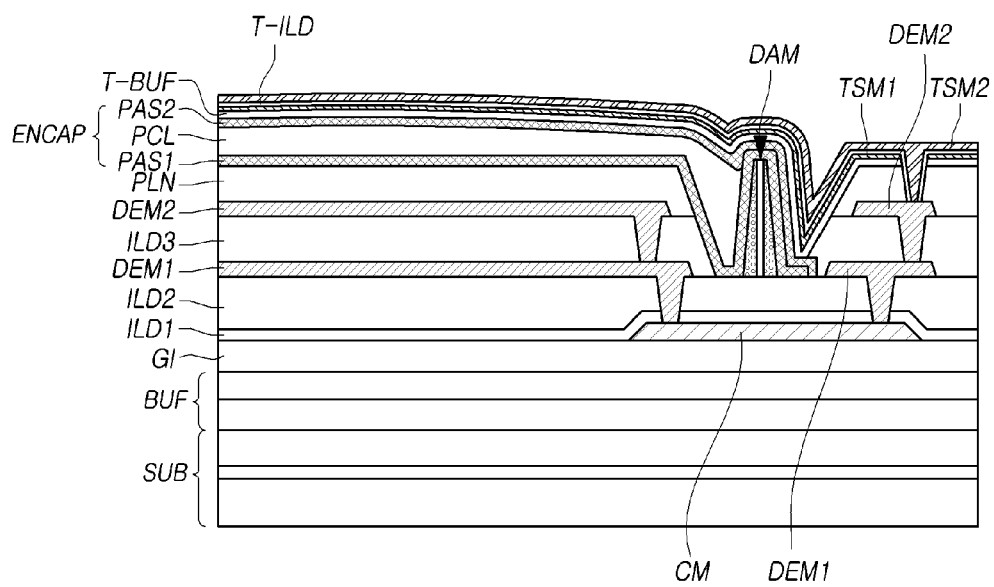
Figure 20F:
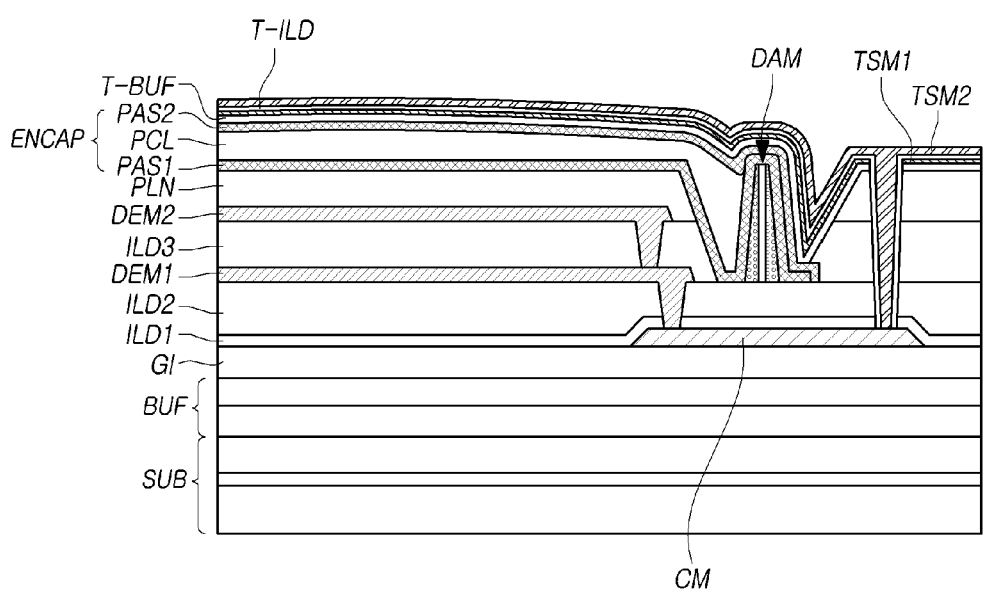

Referring to FIGS. 20E and 20F, a portion of the touch routing line TL can be made by using the first display electrode metal DEM1 and the second display electrode metal DEM2 located under the encapsulation layer ENCAP between the boundary of the active area AA and the dam DAM.

A portion of the same touch routing line TL can be made by using at least one of the first touch sensor metal TSM1 and the second touch sensor metal TSM2 located on the encapsulation layer ENCAP.

The portion made of the display electrode metal DEM and the portion made of the touch sensor metal TSM can be electrically connected outside the dam DAM to constitute one touch routing line TL.

Here, the touch sensor metal TSM constituting the touch routing line TL can be electrically connected to the connecting metal CM through the first display electrode metal DEM1 and the second display electrode metal DEM2 such as an example illustrated in FIG. 20E. Alternatively, the touch sensor metal TSM constituting the touch routing line TL can be directly connected to the connecting metal CM such as an example illustrated in FIG. 20F.

As constituting the touch routing line TL by using the plurality of display electrode metal DEM and the touch sensor metal TSM, the resistance of the touch routing line TL can be reduced. Alternatively, in some cases, the non-active area NA can be reduced by reducing a width of the touch routing line TL.

As described above, according to embodiments of the present disclosure, as constituting the touch routing line TL as various structures by using the display electrode metal DEM located inside the dam DAM, the load of the touch routing line TL can be reduced while reducing the non-active area NA.

In addition, as connecting the display electrode metal DEM located inside the dam DAM to the connecting metal CM located under the dam DAM, the touch routing line TL can be made while maintaining the structure of the encapsulation layer ENCAP. Thus, even if the touch routing line TL is made by using the display electrode metal DEM located under the encapsulation layer ENCAP, it can be prevented that moisture or oxygen permeates to circuit components or the like.

Furthermore, as making a structure to increase a path of moisture permeation on an area where the touch routing line TL or the like are disposed under the encapsulation layer ENCAP, a more robust structure to the moisture permeation can be provided although reducing the non-active area NA.

Figure 21:
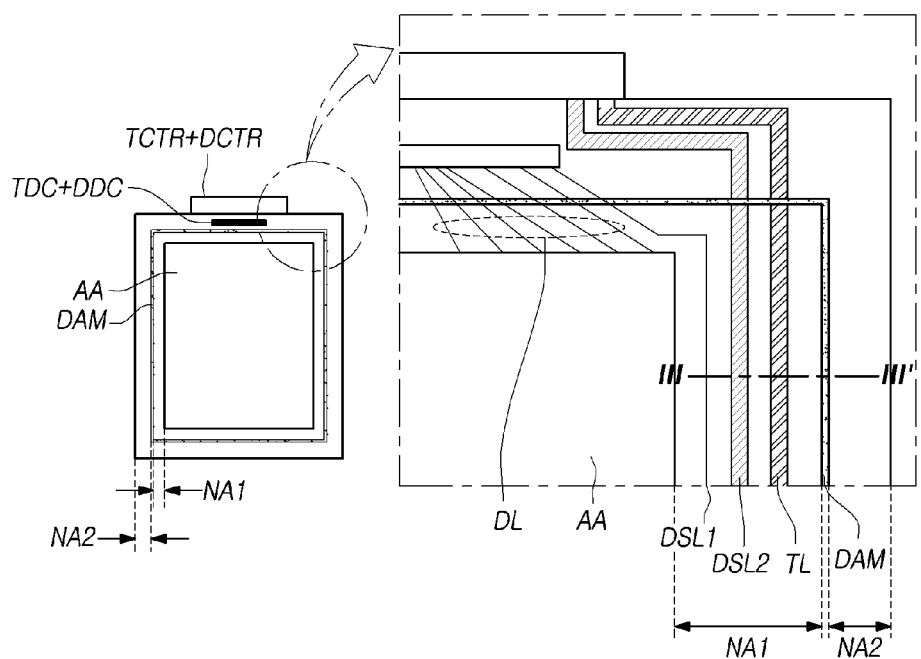
FIG. 21 is a diagram illustrating another example of a planar structure that a touch routing line is disposed in a display panel according to embodiments of the present disclosure.

FIG. 21 is a diagram illustrating another example of a planar structure that the touch routing line TL is disposed in the display panel DISP according to embodiments of the present disclosure. FIGS. 22A to 22D are diagrams illustrating examples of a cross-sectional structure, taken along line III-III' in FIG. 21 according to embodiments of the present disclosure.

Referring to FIG. 21, the first display signal line DSL1, the second display signal line DSL2 and touch routing line TL can be disposed under the encapsulation layer ENCAP on the first non-active area NA1 of the non-active area NA between the boundary of the active area AA and the dam DAM.

Here, a top surface of at least one insulating layer ILD located under the encapsulation layer ENCAP in the first non-active area NA1 can have a curved shape.

Figure 22A:
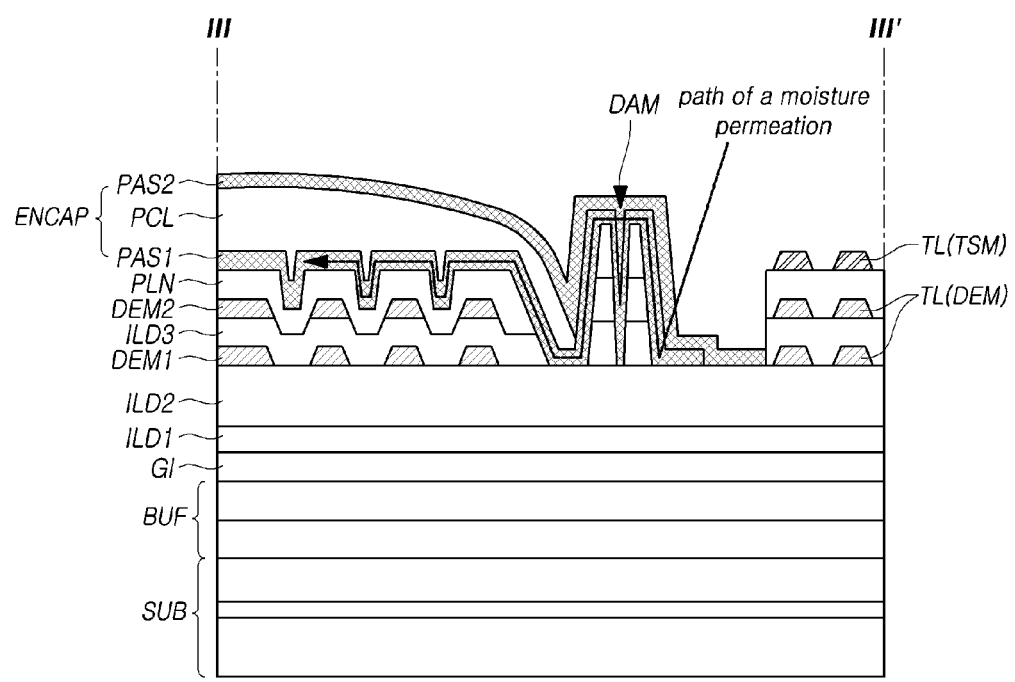
FIGS. 22A to 22D are diagrams illustrating examples of a cross-sectional structure, taken along line III-III' in FIG. 21 according to an embodiment of the present disclosure.

For example, referring to FIG. 22A, the display signal line DSL and the touch routing line TL made of the first display electrode metal DEM1 and the second display electrode metal DEM2 can be disposed under the encapsulation layer ENCAP inside the dam DAM.

A top surface of a third insulating layer ILD3, or a top surface of the planarization layer PLN located between the touch routing line TL and the encapsulation layer ENCAP can have the curved shape.

Since the touch routing line TL is made inside the dam DAM, the display electrode metal DEM can be disposed to be patterned as a certain shape for making the touch routing line TL.

Alternatively, in some cases, a portion of the display electrode metal DEM disposed to be patterned may not be used as the display signal line DSL or the touch routing line TL. That is, the display electrode metal DEM can be disposed to be patterned and can constitute a dummy line.

As the display electrode metal DEM is disposed to be patterned as a certain shape, a top surface of at least one insulating layer ILD disposed on the display electrode metal DEM can have the curved shape. And the path of the moisture permeation can increase by the curved shape of the top surface of the insulating layer ILD.

Thus, while reducing the non-active area NA by making the touch routing line TL with the display electrode metal DEM, it can be prevented to be weak to the moisture permeation due to a reduction of the non-active area NA.

Furthermore, a moisture permeation defect due to a drop of an adhesion between the organic encapsulation layer PCL and the inorganic encapsulation layer PAS1, PAS2 constituting the encapsulation layer ENCAP can be prevented by a structure to increase the path of the moisture permeation above mentioned.

That is, the structure above mentioned can be also applied in a structure that the touch routing line TL isn't disposed under the encapsulation layer ENCAP inside the dam DAM.

Furthermore, as the display electrode metal DEM isn't patterned and the insulating layer ILD is patterned, the path of the moisture permeation can increase.

Figure 22B:
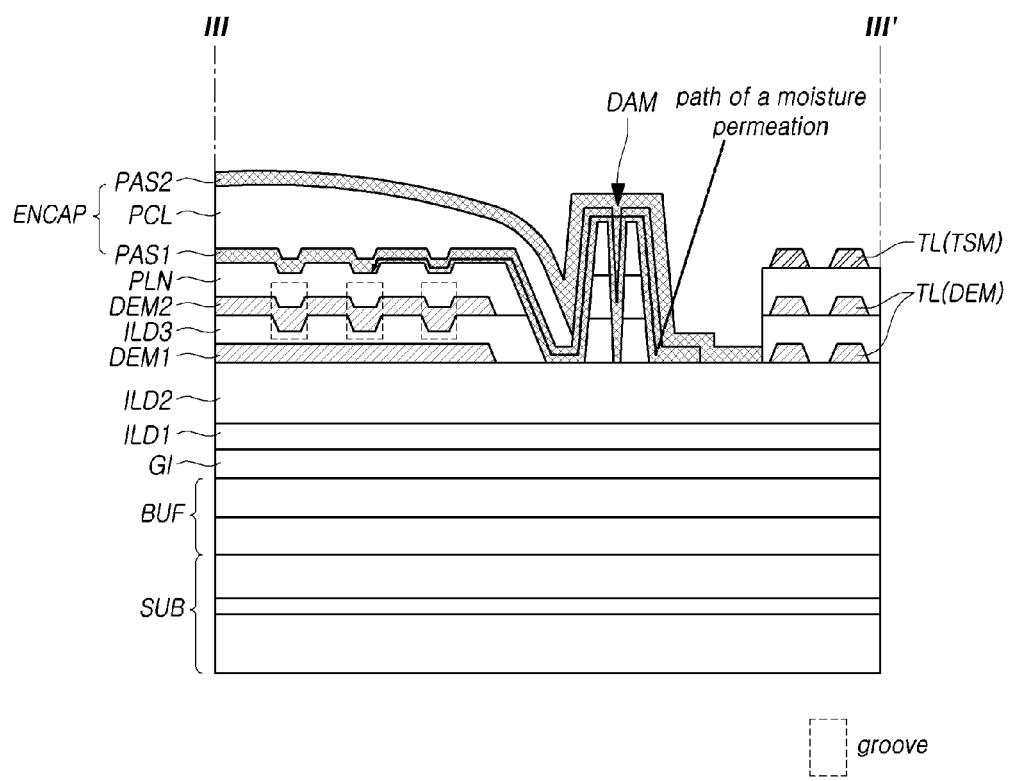

Referring to FIG. 22B, the first display electrode metal DEM1 can be disposed under the encapsulation layer ENCAP inside the dam DAM. And the third insulating layer ILD3 can be disposed on the first display electrode metal DEM1.

Here, the third insulating layer ILD3 can comprise at least one groove. The groove included in the third insulating layer ILD3, for example, can be made along a direction which a line disposed under the encapsulation layer ENCAP is disposed. Alternatively, the groove included in the third insulating layer ILD3 can be made along a direction which the dam DAM is disposed.

As the third insulating layer ILD3 comprises the groove, a top surface of the third insulating layer ILD3 and a top surface of the planarization layer PLN disposed under the encapsulation layer ENCAP can have the curved shape. Thus, the path of the moisture permeation under the encapsulation layer ENCAP can increase inside the dam DAM.

As described above, even if the display electrode metal DEM disposed under the encapsulation layer ENCAP isn't patterned, a robust structure to the moisture permeation can be provided by patterning the insulating layer ILD.

Alternatively, in some cases, the path of the moisture permeation can increase by applying both of a patterning structure of the display electrode metal DEM and a patterning structure of the insulating layer ILD.

Figure 22C:
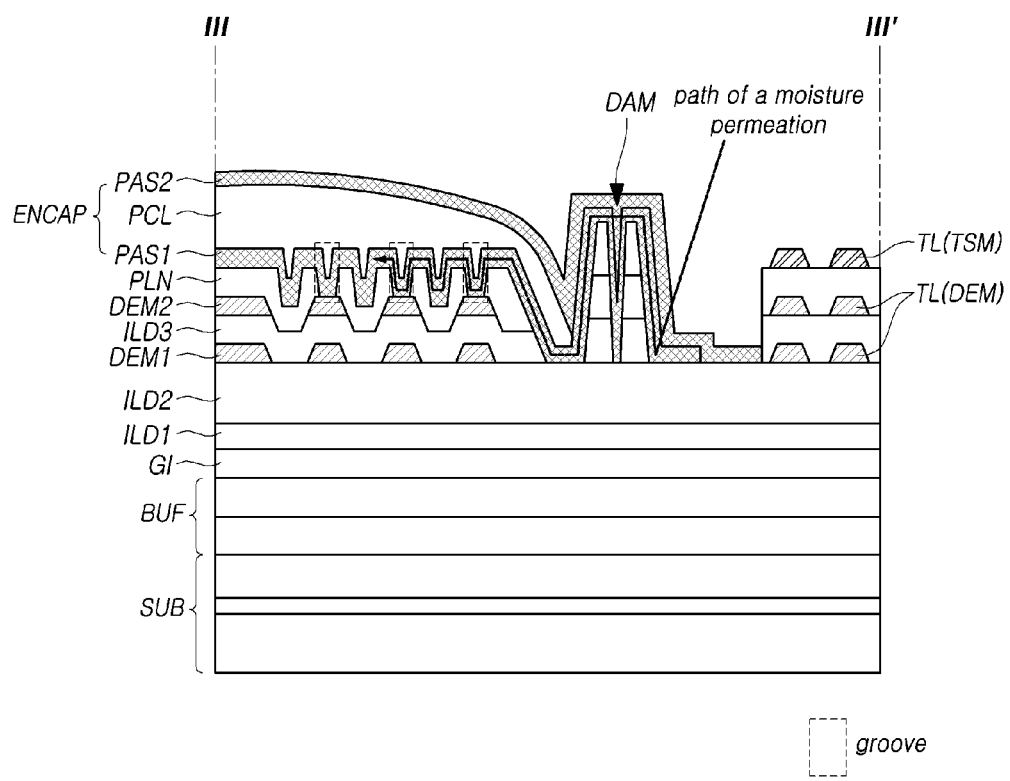

Referring to FIG. 22C, by patterning the first display electrode metal DEM1 and the second display electrode metal DEM2 located under the encapsulation layer ENCAP, the display signal line DSL or the touch routing line TL can be made. Alternatively, one or a portion of the display electrode metal DEM patterned can be a dummy which isn't used as a line.

At least one of the insulating layer ILD located under the encapsulation layer ENCAP can be patterned, and can comprise a groove made along a direction which a line or the dam DAM is disposed.

For example, such as an example illustrated in FIG. 22C, the planarization layer PLN can comprise a plurality of grooves.

Since the display electrode metal DEM located under the encapsulation layer ENCAP is disposed to be patterned and the insulating layer ILD comprises the groove, the path of the moisture permeation can increase more inside the dam DAM.

As described above, according to embodiments of the present disclosure, a robust structure to the moisture permeation can be provided by increasing the path of the moisture permeation inside the dam DAM by a structure patterning at least one of the display electrode metal DEM and the insulating layer ILD in at least a part of the non-active area NA.

In addition, in a structure that the path of the moisture permeation increase, the touch routing line TL located outside the dam DAM can be moved to be disposed inside the dam DAM.

Figure 22D:
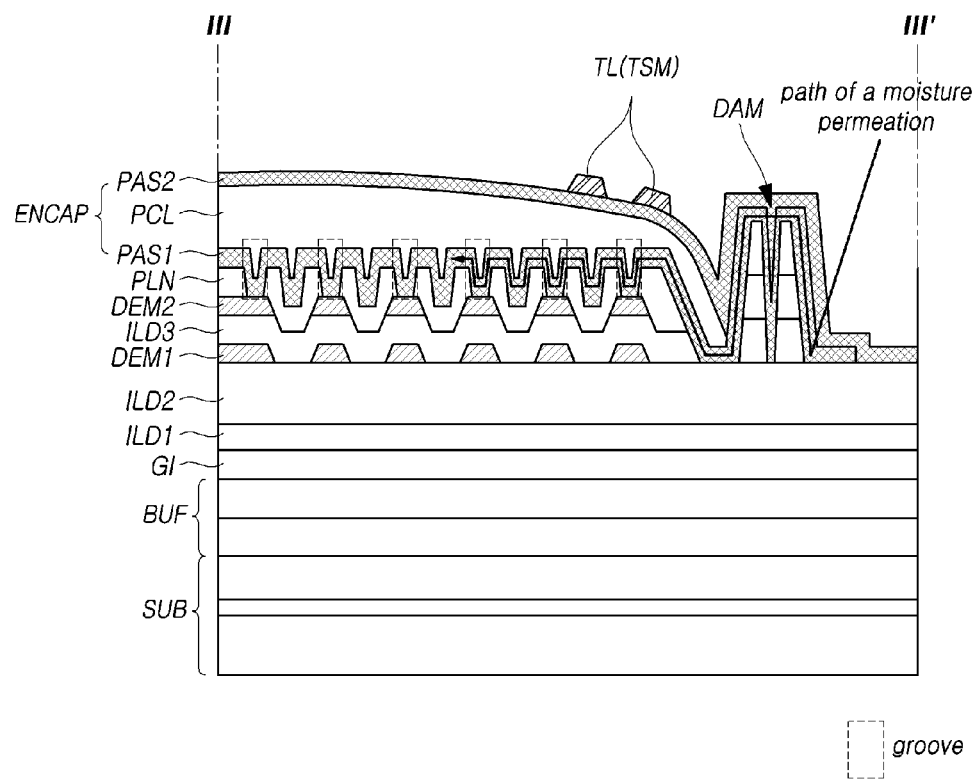

Referring to FIG. 22D, the display electrode metal DEM patterned can be disposed under the encapsulation layer ENCAP inside the dam DAM. Also, at least one insulating layer ILD located under the encapsulation layer ENCAP can comprise the groove.

The touch routing line TL made of the touch sensor metal TSM can be disposed on the encapsulation layer ENCAP.

As the touch routing line TL is made by using a portion of the display electrode metal DEM located under the encapsulation layer inside the dam DAM and also the touch routing line TL is made by using the touch sensor metal TSM located on the encapsulation layer ENCAP, a width of an outside area of the dam DAM can be reduced.

Thus, the non-active area NA can be reduced. Even if the non-active area NA is reduced, since a structure increasing the path of the moisture permeation is provided inside the dam DAM, the touch display device which is robust to the moisture permeation can be provided while reducing the non-active area NA.

According to embodiments of the present disclosure, as disposing the touch routing line TL by using the display electrode metal DEM disposed on the non-active area NA of the display panel DISP, the non-active area NA required for an arrangement of the touch routing line TL can be reduced.

Furthermore, as the touch routing line TL is made as various structures by using the display electrode metal DEM and the touch sensor metal TSM, the load of the touch routing line TL can be reduced while reducing an area where the touch routing line TL is disposed.

Furthermore, since the touch routing line TL made under the encapsulation layer ENCAP inside the dam DAM is connected to the touch electrode line TEL on the encapsulation layer through the connecting metal CM located under the dam DAM, the touch routing line TL can be disposed while providing a function for preventing the moisture permeation by maintaining a structure of the encapsulation layer ENCAP originally.

Furthermore, as increasing the path of the moisture permeation inside the dam DAM by a structure patterning at least one of a metal or the insulating layer ILD located under the encapsulation layer ENCAp inside the dam DAM, a robust structure to the moisture permeation can be provided even if the non-active area NA is reduced.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device, comprising:
   a plurality of touch electrodes disposed on an active area, the plurality of touch electrodes located on an encapsulation layer;
   at least one dam disposed to be apart from a boundary of the active area in at least one side of the active area; and
   a plurality of touch routing lines disposed on a non-active area located outside of the active area, the plurality of touch routing lines electrically connected to at least one of the plurality of touch electrodes,
   wherein the plurality of touch routing lines comprises:
      a first touch routing line located on the encapsulation layer between the boundary of the active area and the at least one dam, the first touch routing line electrically connected to the at least one of the plurality of touch electrodes; and
      a second touch routing line comprising a first part located under the encapsulation layer between the boundary of the active area and the dam, a second part electrically connected to the first part and located under the dam to be crossed by the dam, and a third part electrically connected to the second part and located on the dam and electrically connected to the at least one of the plurality of touch electrodes.

2. The touch display device of claim 1, wherein the second touch routing line further comprises:
   a fourth part located on the encapsulation layer, overlapped with at least a portion of the first part, and electrically connected to the first part through at least one of the second part and the third part.

3. The touch display device of claim 2, wherein the fourth part is made of a same material as the third part.

4. The touch display device of claim 1, wherein the first part and the second part are electrically connected to each other inside of the dam, and the second part and the third part are electrically connected to each other outside of the dam.

5. The touch display device of claim 1, wherein the second part and the third part are directly connected to each other, or the second part and the third part are electrically connected to each other by a connecting pattern being made of a same material as the first part.

6. The touch display device of claim 1, wherein the first part comprises a first electrode material disposed on a first layer under the encapsulation layer that is connected to a second electrode material disposed on a second layer located between the first layer and the encapsulation layer.

7. The touch display device of claim 1, further comprising:
   a plurality of display signal lines disposed on a same layer with the first part and located between the first part and the boundary of the active area.

8. The touch display device of claim 7, further comprising:
   a display electrode disposed between the plurality of display signal lines and the first touch routing line, the display electrode supplied a constant voltage for driving a display.

9. The touch display device of claim 8, wherein a portion of the display electrode is overlapped with at least one of the plurality of display signal lines and the first touch routing line.

10. The touch display device of claim 8, wherein the display electrode is disposed on an area other than an area overlapped with the first part.

11. The touch display device of claim 8, wherein the first part is located between an outer line of the display electrode and the dam.

12. The touch display device of claim 1, further comprising:
   at least one insulating layer located between the first part and the encapsulation layer, and at least a portion of a top surface of the at least one insulating layer is curved.

13. The touch display device of claim 12, wherein the at least one insulating layer comprises at least one groove disposed along a direction which the first part is disposed.

14. The touch display device of claim 1, wherein the first touch routing line is located between the boundary of the active area and the second touch routing line.

15. The touch display device of claim 1, wherein the plurality of touch routing lines further comprises:
   a third touch routing line, a portion of a third touch routing line is located outside of the dam, the third touch routing line is made of at least one of a same material as the first part and a same material as the third part, and the third touch routing line is electrically connected to the touch electrode.

16. A touch display device, comprising:
   a plurality of touch electrodes disposed on an active area and located on an encapsulation layer;
   at least one dam disposed to be apart from a boundary of the active area in at least one side of the active area; and
   a plurality of touch routing lines disposed on a non-active area located outside of the active area, the plurality of touch routing lines electrically connected to at least one of the plurality of touch electrodes,
   wherein at least one of the plurality of touch routing lines crosses the dam on at least two points, is located under the dam on at least one of the at least two points, and is located on the dam on at least one of the at least two points.

17. The touch display device of claim 16, wherein a portion of the at least one of the plurality of touch routing lines is located under the encapsulation layer between the boundary of the active area and the dam.

18. The touch display device of claim 17, wherein another portion of the at least one of the plurality of touch routing lines is located on the encapsulation layer between the boundary of the active area and the dam, and the portion and the other portion are physically separated each other between the boundary of the active area and the dam.

19. The touch display device of claim 16, wherein the at least one of the plurality of touch routing lines comprises a part located under the dam and a part located on the dam on at least one point of the at least two points.

20. The touch display device of claim 19, wherein the part located under the dam and the part located on the dam are outside of the dam, directly connected with each other, or electrically connected by a connecting pattern.

* * * * *